(12) United States Patent
Kasai

(10) Patent No.: US 8,610,644 B2
(45) Date of Patent: Dec. 17, 2013

(54) ELECTRO-OPTICAL DEVICE, METHOD OF DRIVING ELECTRO-OPTICAL DEVICE, AND ELECTRONIC APPARATUS

(75) Inventor: Toshiyuki Kasai, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 1177 days.

(21) Appl. No.: 12/365,358

(22) Filed: Feb. 4, 2009

(65) Prior Publication Data

US 2009/0195534 A1    Aug. 6, 2009

(30) Foreign Application Priority Data

Feb. 6, 2008   (JP) ................................. 2008-026580
Sep. 16, 2008  (JP) ................................. 2008-236499

(51) Int. Cl.
*G09G 3/30* (2006.01)

(52) U.S. Cl.
USPC .............................................. 345/76; 345/82

(58) Field of Classification Search
USPC .............. 345/76–82, 87–100, 204; 315/169.3
See application file for complete search history.

(56) References Cited

U.S. PATENT DOCUMENTS

| | | | |
|---|---|---|---|
| 4,582,395 | A | 4/1986 | Morozumi |
| 5,714,968 | A | 2/1998 | Ikeda |
| 5,903,249 | A | 5/1999 | Koyama et al. |
| 6,933,756 | B2 * | 8/2005 | Miyazawa .................... 345/204 |
| 8,018,404 | B2 * | 9/2011 | Ono ................................ 345/76 |
| 8,022,901 | B2 * | 9/2011 | Takahashi et al. .............. 345/76 |
| 2004/0032387 | A1 * | 2/2004 | Lin et al. .......................... 345/98 |
| 2004/0145583 | A1 | 7/2004 | Morita |
| 2004/0201550 | A1 * | 10/2004 | Nakamura et al. .............. 345/55 |

(Continued)

FOREIGN PATENT DOCUMENTS

| | | |
|---|---|---|
| JP | A-08-054836 | 2/1996 |
| JP | A 2000-122608 | 4/2000 |

(Continued)

OTHER PUBLICATIONS

Extended European Search Report mailed Feb. 14, 2011, completed Jan. 31, 2011 in European Application No. 09 00 1504.

*Primary Examiner* — Regina Liang
(74) *Attorney, Agent, or Firm* — Oliff & Berridge, PLC

(57) ABSTRACT

An electro-optical device includes a plurality of unit circuits that are disposed in correspondence with intersections of a plurality of scanning lines and a plurality of data lines, a scanning line driving circuit that sequentially selects the plurality of scanning lines, one scanning line being selected for a drive period of one unit period, and a data line driving circuit that outputs data electric potentials to the plurality of data lines for a write period of the one unit period, the data electric potentials corresponding to gray scale data of the plurality of unit circuits that are in correspondence with the one scanning line selected for the drive period of the one unit period and the write period being a period before the each drive period starts. Each of the plurality of unit circuits has an electro-optical element that has a gray scale level corresponding to the data electric potential, a capacitor element that has a first electrode connected to a capacitor line and a second electrode connected to the data line, and a switching element that is disposed between the second electrode and the electro-optical element and is in a conductive state at a time when the one scanning line is selected by the scanning line driving circuit for making the second electrode and the electro-optical element to be conductive to each other.

10 Claims, 24 Drawing Sheets

(56) References Cited

U.S. PATENT DOCUMENTS

| | | | |
|---|---|---|---|
| 2006/0001617 A1* | 1/2006 | Shin et al. | 345/76 |
| 2006/0001634 A1* | 1/2006 | Lee et al. | 345/98 |
| 2006/0231740 A1* | 10/2006 | Kasai | 250/214.1 |
| 2006/0267885 A1* | 11/2006 | Kwak et al. | 345/76 |
| 2007/0063935 A1* | 3/2007 | Yoshida | 345/76 |
| 2007/0229428 A1* | 10/2007 | Nakagawa et al. | 345/92 |
| 2008/0030437 A1* | 2/2008 | Iida et al. | 345/80 |
| 2008/0036704 A1* | 2/2008 | Kim et al. | 345/76 |
| 2008/0136983 A1* | 6/2008 | Huang | 349/38 |

FOREIGN PATENT DOCUMENTS

| | | |
|---|---|---|
| JP | A-2000-242234 | 9/2000 |
| JP | A-2003-066871 | 3/2003 |
| JP | A-2007-041229 | 2/2007 |

\* cited by examiner

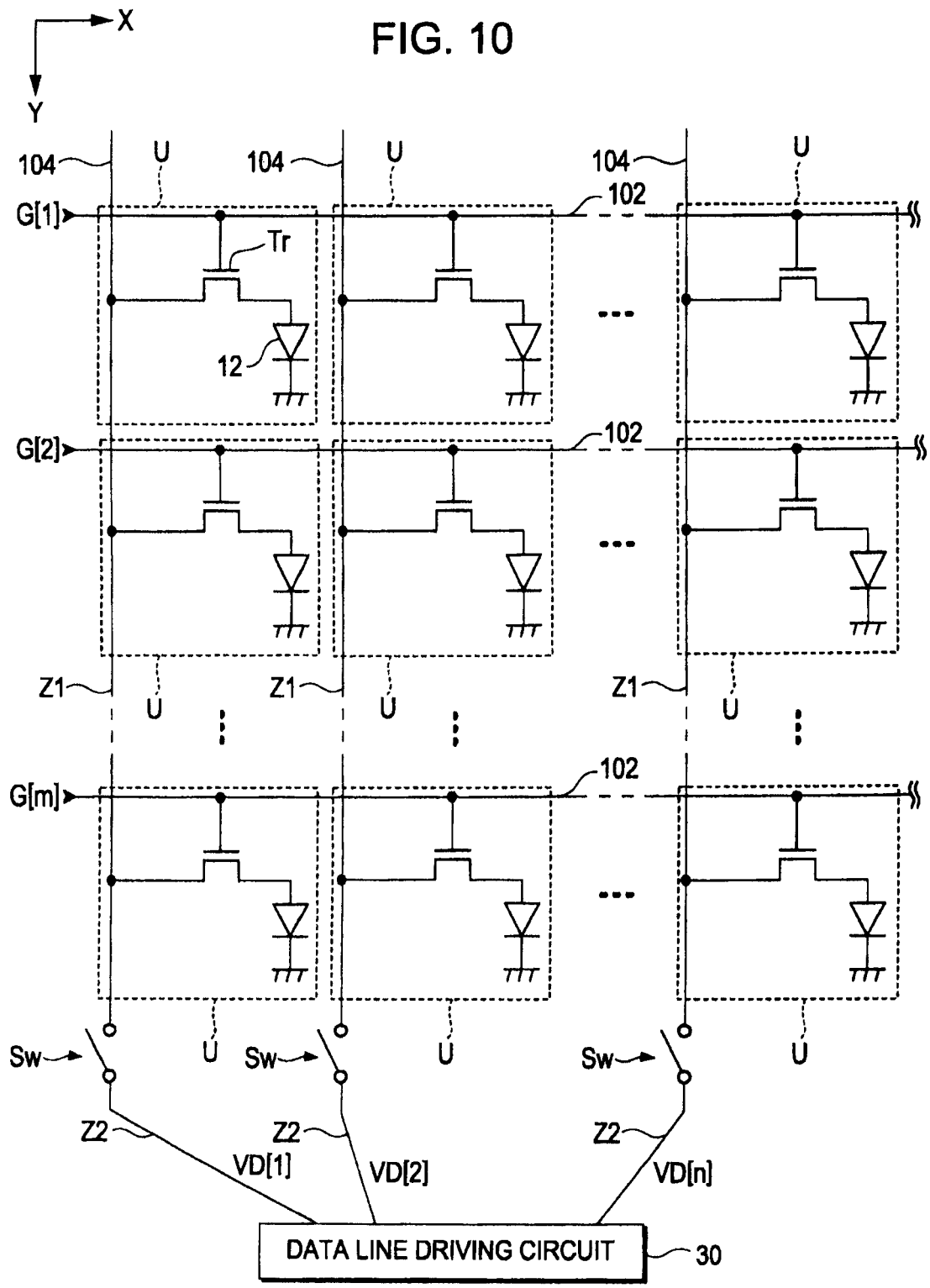

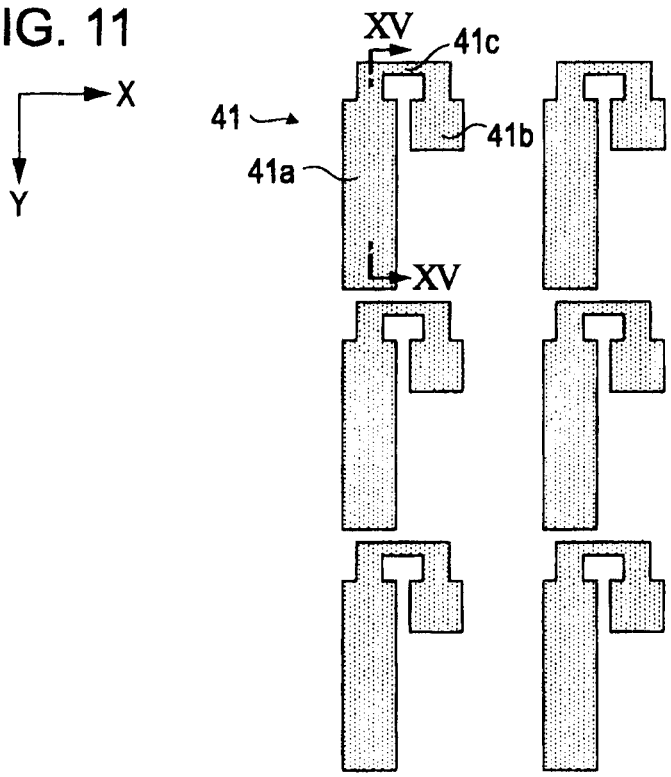
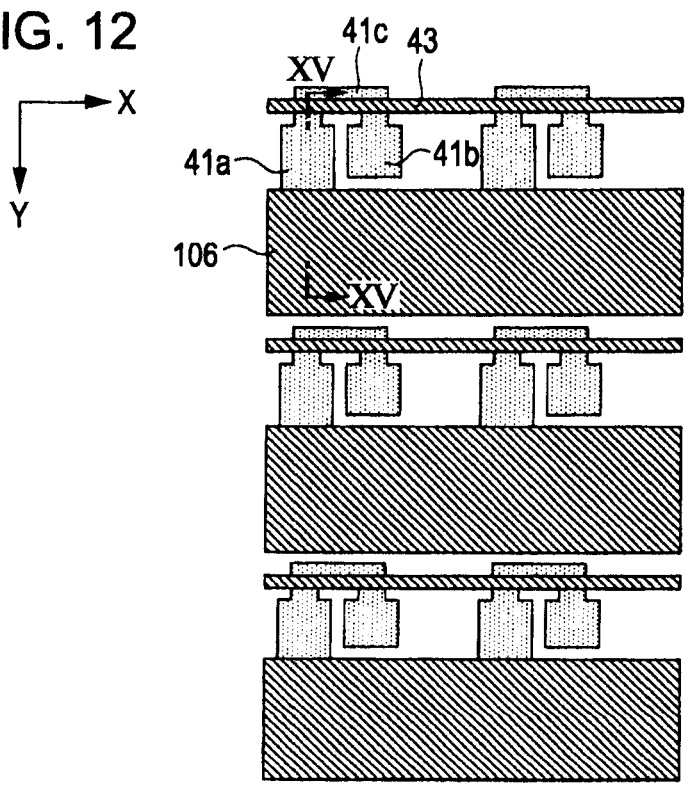

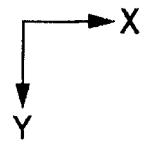
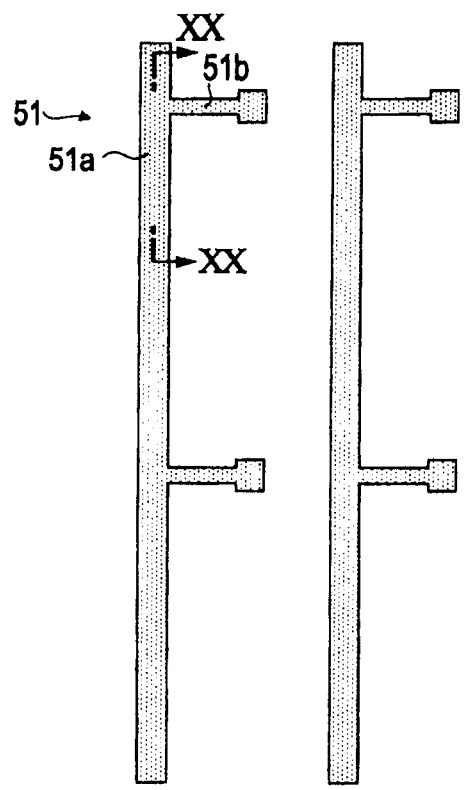
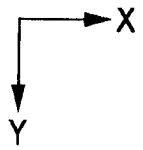
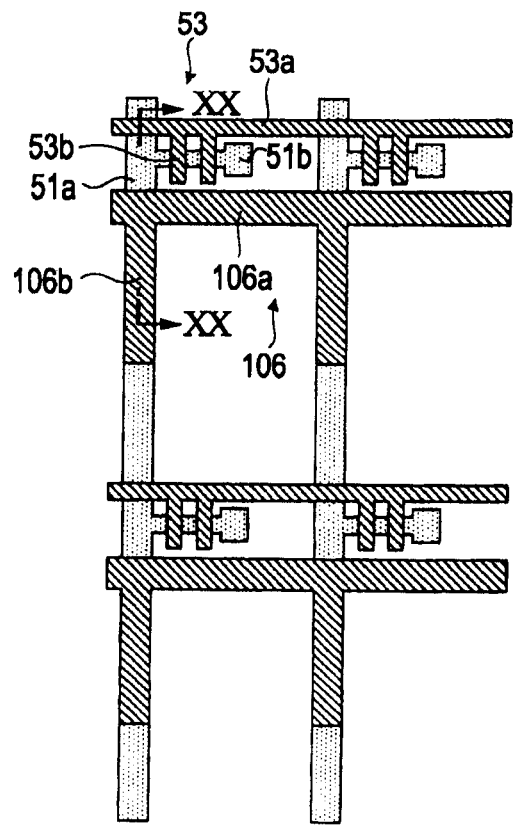

ELECTRO-OPTICAL DEVICE, METHOD OF DRIVING ELECTRO-OPTICAL DEVICE, AND ELECTRONIC APPARATUS

This application claims priority from Japanese Patent Application No. 2008-026580 filed in the Japanese Patent Office on Feb. 6, 2008, and Japanese Patent Application No. 2008-236499 filed in the Japanese Patent Office on Sep. 16, 2008, the entire disclosures of which are hereby incorporated by reference in their entireties.

BACKGROUND

1. Technical Field

The present invention relates to an electro-optical device using an electro-optical element, a method of driving the electro-optical device, and an electronic apparatus.

2. Related Art

Recently, various image display devices using electro-optical elements such as organic light emitting diode elements (hereinafter referred to as OLED) referred to as organic EL (Electroluminescent) elements, light emitting polymer elements, or the like have been proposed.

FIG. 31 is a diagram showing the configuration of a unit circuit P of an image display device disclosed in JP-A-2000-122608. In the image display device disclosed JP-A-2000-122608, a plurality of the unit circuits P is disposed in correspondence with intersections of a plurality of scanning lines and a plurality of data lines. FIG. 31 shows the configuration of one unit circuit P of the plurality of the unit circuits. As shown in FIG. 31, the drain of an N-channel type transistor Ts is connected to the data line, and the source of the transistor is connected to an anode of an OLED element and one electrode of a capacitor element Co. The gate of the transistor Ts is connected to the scanning line. In addition, as shown in FIG. 29, the OLED element and the capacitor element Co are connected in parallel, and a cathode of the OLED element and the other electrode of the capacitor element Co is commonly connected to a fixed electric potential.

Under the above-described configuration, first, when a scanning signal supplied to the scanning line transits to an active state, the transistor Ts is in the ON state. Accordingly, a data electric potential supplied to the data line is supplied to the OLED element through the transistor Ts and is written in the capacitor element Co. Second, when the scanning signal transits to a non-active state, the transistor Ts is in the OFF state. However, while electric charges accumulated in the capacitor element Co remain, the light emitting state of the OLED element continues.

However, in the configuration of JP-A-2000-122608, in order to acquire a sufficient amount of light emission (a value acquired from integrating the luminance of light emission with respect to time) of the OLED element, the light emitting time of the OLED element is needed to be sufficiently acquired. Accordingly, the capacitance of the capacitor element Co is needed to be set to a very large value.

SUMMARY

An advantage of some aspects of the invention is that it provides an electro-optical device using an electro-optical element, a method of driving the electro-optical device, and an electronic apparatus capable of acquiring a sufficient amount of light emission with the capacitance of the capacitor element of each unit circuit decreased.

According to a first aspect of the invention, there is provided an electro-optical device including: a plurality of unit circuits that are disposed in correspondence with intersections of a plurality of scanning lines and a plurality of data lines; a scanning line driving circuit that sequentially selects the plurality of scanning lines, one scanning line being selected for a drive period of one unit period; and a data line driving circuit that outputs data electric potentials to the plurality of data lines for a write period of the one unit period, the data electric potentials corresponding to gray scale data of the plurality of unit circuits that are in correspondence with the one scanning line selected for the drive period of the one unit period and the write period being a period before the drive period starts. Each of the plurality of unit circuits has: an electro-optical element that has a gray scale level corresponding to the data electric potential; a capacitor element that has a first electrode connected to a capacitor line and a second electrode connected to the data line; and a switching element that is disposed between the second electrode and the electro-optical element and is in a conductive state at a time when the one scanning line is selected by the scanning line driving circuit for making the second electrode and the electro-optical element to be conductive to each other. In the above-described electro-optical device, it may be configured that, for the write period, electric charges corresponding to the data electric potential that is output from the data line driving circuit are charged in the capacitor element of the each unit circuit and, for the drive period, the electric charges charged in the write period are supplied to the electro-optical element of the each unit circuit corresponding to the one scanning line selected by the scanning line driving circuit from a plurality of the capacitor elements connected to the data line corresponding to the each unit circuit.

According to the above-described electro-optical device, for the drive period of the unit period, electric charges charged for the write period within the unit period are supplied altogether to the unit circuit corresponding to the scanning line selected by the scanning line driving circuit from the plurality of capacitor elements connected to the data line corresponding to the unit circuit. Accordingly, the light emitting time of the electro-optical element of the unit circuit can be acquired sufficiently. As a result, the amount of light emission of the electro-optical element can be a sufficient value, and the required capacitance value of the capacitor element of each unit circuit can decrease, compared to that in a configuration (hereinafter, referred to as a general example) shown in FIG. 31.

In the above-described electro-optical device, the electro-optical element of each of the plurality of unit circuits may include a third electrode connected to the switching element, a fourth electrode connected to a constant electric potential line to which a constant electric potential is supplied, and an optical layer that is interposed between the third electrode and the fourth electrode, and the capacitor line may be the constant electric potential line. In such a case, the capacitor line is not needed separately from the electric potential line, and accordingly, the configuration of the electro-optical device can be simplified.

In the above-described electro-optical device, an auxiliary capacitor element having one electrode connected to the data line may be disposed in each of the unit circuits in addition to the capacitor element of each of the unit circuits. In such a case, even when the total capacitance value of the capacitor elements connected to the data line corresponding to the unit circuit is smaller than the capacitance value needed for a sufficient value of the amount of light emission of the electro-optical device of the unit circuit corresponding to the selected scanning line, the lacking amount can be supplemented by the capacitance of the auxiliary capacitor.

The above-described electro-optical device may further include switching elements that connect the data line driving circuit and the plurality of data lines, as an appropriate embodiment of the invention. In addition, it may be configured that the auxiliary capacitor element includes a plurality of capacitor elements having different capacitance values and a second switching element that makes one capacitor element of the plurality of the capacitor elements to be conductive to the data line and that is disposed between the electrodes of the plurality of the capacitor elements and the data line, as a more appropriate embodiment of the invention. In such a case, the light emitting time of the electro-optical element can be controlled by selectively making any one of the plurality of capacitor elements to be conductive to the data line in the write period. Accordingly, the amount of light emission of the electro-optical element can be controlled to be at a plurality of levels.

In the above-described electro-optical device, it may be configured that each of the plurality of the data lines is configured by a first part that is connected to the plurality of the unit circuits and has a same length in the plurality of the data lines and a second part that is connected to the data line driving circuit and has a different length in the plurality of the data lines, a third switching element used for switching between conduction and non-conduction of the first part and the second part is disposed between the first part and the second part, and the third switching element is in the ON state for the write period of the unit period and is in the OFF state for the drive period of the unit period. In such a case, the second part of each data line is separated in the drive period of the unit period. Since the lengths of the first parts of the data lines are the same, occurrence of unbalance of capacitor values in the data lines can be suppressed. Accordingly, dispersion of the amounts of light emission of the electro-optical elements for each data line can be suppressed.

According to a second aspect of the invention, there is provided an electro-optical device including: a plurality of scanning lines; a plurality of data lines; a plurality of unit circuits that are disposed in correspondence with the plurality of scanning lines and the plurality of data lines; and a plurality of capacitor elements that are disposed along the plurality of data lines. Each of the plurality of unit circuits has: an electro-optical element; and a switching element that is controlled in accordance with a scanning signal supplied to one scanning line of the plurality of scanning lines and controls conduction between the plurality of capacitor elements and the electro-optical element.

In the above-described electro-optical device, it may be configured that the plurality of unit circuits has a unit circuit group formed of two or more unit circuits connected to one data line of the plurality of data lines, and the plurality of capacitor elements is separately disposed in correspondence with each of the unit circuits belonging to the unit circuit group.

According to a third aspect of the invention, there is provided an electro-optical device including: a plurality of unit circuits that are disposed in correspondence with intersections of a plurality of scanning lines and a plurality of data lines; a scanning line driving circuit that sequentially selects the plurality of scanning lines, one scanning line being selected for a drive period of one unit period; a data line driving circuit that outputs data electric potentials to the plurality of data lines for a write period of the one unit period, the data electric potentials corresponding to gray scale data of the plurality of unit circuits that are in correspondence with the one scanning line selected for the drive period of the one unit period and the write period being a period before the drive period starts; and a first switching element (for example, a switch Sw shown in FIG. 10) that is a switching element disposed in correspondence with each of the plurality of data lines, is in a conductive state for the write period so as to make the data line and the data line driving circuit to be conductive to each other, and is in a non-conductive state for the drive period so as to make the data line and the data line driving circuit to be non-conductive to each other. Each of the plurality of unit circuits has: an electro-optical element that has a gray scale level corresponding to the data electric potential; and a second switching element (for example, a transistor Tr shown in FIG. 10) that is disposed between the data line and the electro-optical element and is in the conductive state at a time when the scanning line is selected by the scanning line driving circuit so as to make the data line and the electro-optical element to be conductive to each other. In addition, for the write period, electric charges corresponding the data electric potential output from the data line driving circuit are charged in each data line (for example, first parts Z1 shown in FIG. 10), and, for the drive period, the plurality of data lines is electrically separated from the data line driving circuit and the electric charges charged for the write period are supplied to the electro-optical element of each of the plurality of unit circuits corresponding to the scanning line selected by the scanning line driving circuit from the capacitance accompanied in the data line corresponding to the each of the plurality of unit circuits.

According to the above-described electro-optical device, the electric charges charged in the capacitance accompanied in one data line for the write period can be used for light emission of one electro-optical element for the drive period, and accordingly, the capacitor element is not needed to be disposed in each unit circuit. As a result, there is an advantage that high definition can be achieved, compared to a configuration in which the capacitor element is disposed in each unit circuit.

The above-described electro-optical device may be used in various electronic apparatuses. A typical example of the electronic apparatus is an apparatus in which a light emitting device is used as a display unit. As apparatuses of this type, there are a personal computer, a cellular phone, and the like. However, the use of the light emitting device according to an embodiment of the invention is not limited to display of an image. For example, in an image forming apparatus (printing apparatus) having a configuration in which a latent image is formed in an image carrier such as photosensitive drum by projecting a light beam, the electro-optical device according to an embodiment of the invention may be used as an exposure unit (so-called an exposure head) that exposes the image carrier.

According to a fourth aspect of the invention, there is provided a method of driving an electro-optical device including a plurality of unit circuits that are disposed in correspondence with intersections of a plurality of scanning lines and a plurality of data lines. Each of the plurality of unit circuits includes: an electro-optical element that has a gray scale level corresponding to a data electric potential; a capacitor element that has a first electrode connected to a capacitor line and a second electrode connected to the data line; and a switching element that is disposed between the second electrode and the electro-optical element and is in the conductive state at a time when the scanning line is selected so as to make the second electrode and the electro-optical element to be conductive to each other. The method includes: sequentially selecting the plurality of the scanning lines, one scanning line being selected for a drive period of one unit period; and outputting data electric potentials corresponding to gray scale data of the unit circuits that are in correspondence with the one scanning line selected for the drive period of the one unit period and the write period being a period before the drive period starts.

According to a fifth aspect of the invention, there is provided a method of driving an electro-optical device including a plurality of unit circuits that are disposed in correspondence with intersections of a plurality of scanning lines and a plurality of data lines. Each of the plurality of unit circuits includes an electro-optical element that has a gray scale level corresponding to a data electric potential. The method includes: charging electric charges corresponding to the data electric potentials in capacitance accompanied in the data lines by outputting the data electric potentials to the plurality of data lines for a write period of one unit period, the data electric potentials corresponding to gray scale data of the plurality of unit circuits that are in correspondence with one scanning line selected in a drive period of the one unit period and the write period being a period before the drive period starts; sequentially selecting the plurality of scanning lines, one scanning line being selected for the drive period of the one unit period; and supplying the electric charges charged in the write period of the one unit period to the electro-optical element of the unit circuit from the capacitance accompanied in the data line corresponding to the unit circuit belonging to the selected scanning line.

BRIEF DESCRIPTION OF THE DRAWINGS

The invention will be described with reference to the accompanying drawings, wherein like numbers reference like elements;

FIG. 10 is a circuit diagram showing the configuration of an electro-optical device according to a fifth embodiment of the invention;

FIG. 11 is a plan view of a unit circuit of an electro-optical device according to the first embodiment in a step of a manufacturing process;

FIG. 12 is a plan view of the unit circuit of the electro-optical device according to the first embodiment in a step of the manufacturing process;

FIG. 16 is a plan view of a unit circuit of an electro-optical device according to the first embodiment in a step of a manufacturing process;

FIG. 17 is a plan view of the unit circuit of the electro-optical device according to the first embodiment in a step of the manufacturing process;

DETAILED DESCRIPTION OF EMBODIMENTS

First Embodiment

Figure 1:
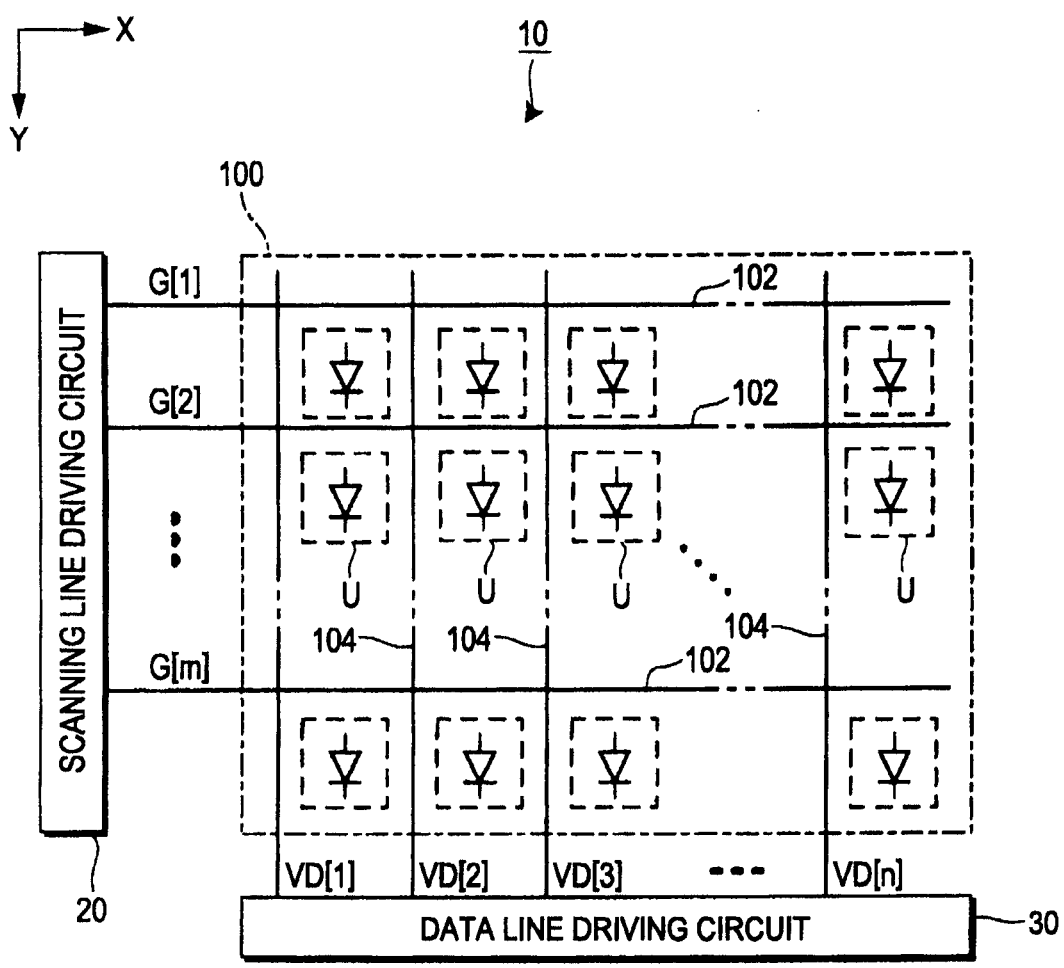
FIG. 1 is a block diagram showing the configuration of an electro-optical device according to a first embodiment of the invention.

FIG. 1 is a block diagram showing the configuration of an electro-optical device 10 according to a first embodiment of the invention. The electro-optical device 10 is a device that is employed in various electronic apparatuses as means for displaying an image. The electro-optical device has a pixel array unit 100 in which a plurality of unit circuits U are arranged in a planar shape, a scanning line driving circuit 20, and a data line driving circuit 30. In FIG. 1, although the scanning line driving circuit 20 and the data line driving circuit 30 are shown as separate circuits, however, a part or the whole of the circuits may be configured as a single circuit.

As shown in FIG. 1, in the pixel array unit 100, m scanning lines 102 that extend in the direction X and n data lines 104 that extend in the direction Y perpendicular to the direction X are disposed (here, m and n are natural numbers). Each unit circuit U is disposed in a position corresponding to an intersection of the scanning line 102 and the data line 104. Accordingly, the unit circuits U are arranged in the shape of a matrix of vertical m rows and horizontal n columns.

The scanning line driving circuit 20 shown in FIG. 1 is a circuit for selecting the plurality of unit circuits U in units of rows. The scanning line driving circuit 20 generates scanning signals G[1] to G[m] that sequentially are in an active state and outputs the scanning signals to the m scanning lines 102. Transition to the active state of the scanning signal G[i] supplied to the scanning line 102 of the i-th row (where, i is an integer satisfying the condition of "1≤i≤m") means selection of n unit circuits U belonging to the i-th row.

The data line driving circuit 30 shown in FIG. 1 generates data electric potentials VD[1] to VD[n] corresponding to gray scale data of the n unit circuits U of one row corresponding to the scanning line 102 selected by the scanning line driving circuit 20 and outputs the data electric potentials to the data lines 104. Hereinafter, the data electric potential VD output to the j-th (where j is an integer satisfying the condition of "1≤j≤n") data line 104 is denoted by VD[j].

Figure 2:
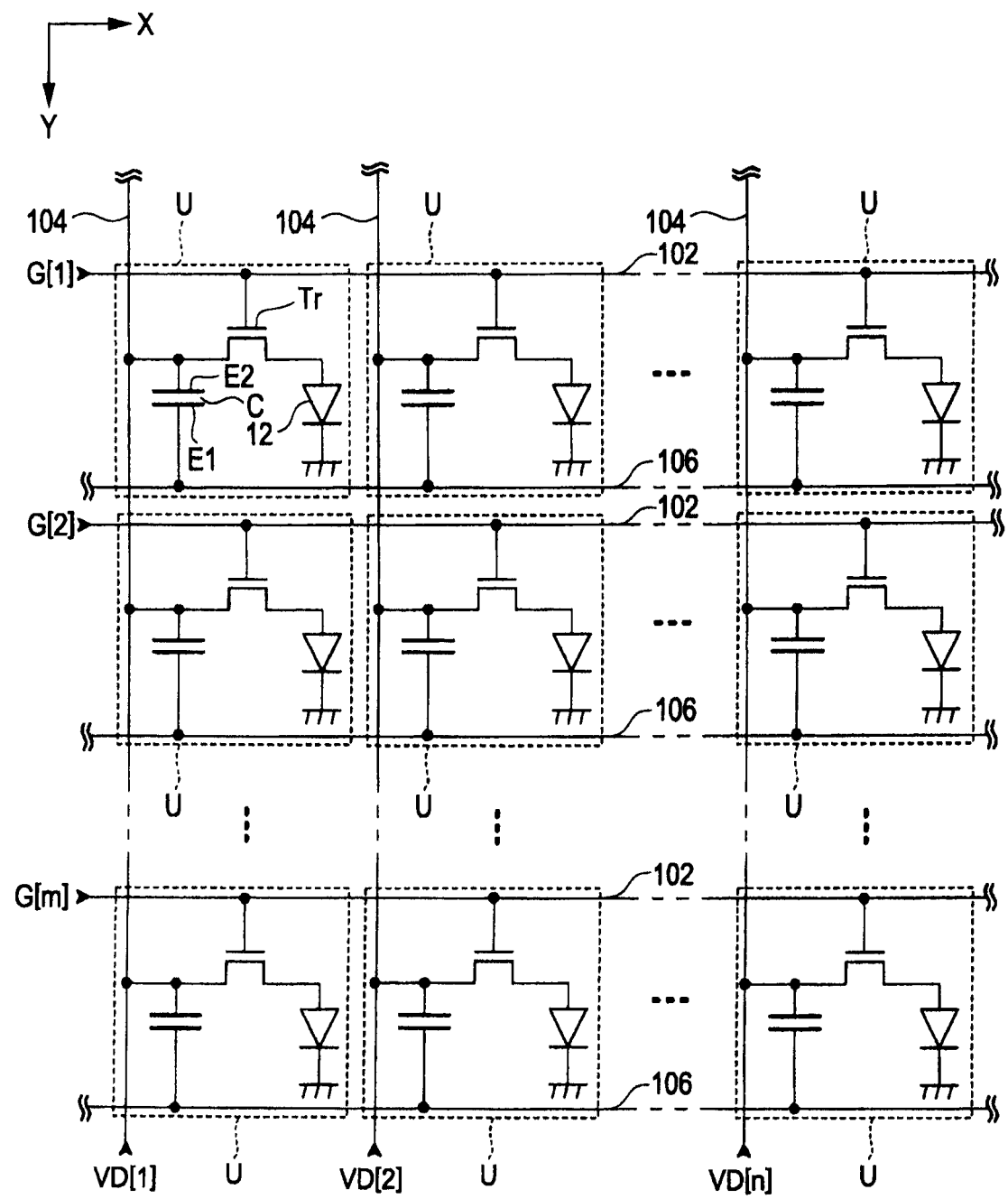
FIG. 2 is a circuit diagram showing a detailed electrical configuration of each unit circuit.

FIG. 2 is a circuit diagram showing a detailed electrical configuration of each unit circuit U. As shown in FIG. 2, each unit circuit U has an electro-optical element 12, a capacitor element C, and a transistor Tr. An electro-optical element 12 is an OLED element formed by interposing a light emitting layer formed of an organic EL material between an anode and a cathode. As shown in FIG. 2, the electro-optical element 12 is disposed between the transistor Tr and a constant electric potential line (ground line) to which a constant electric potential is supplied. Here, the anode is disposed in each unit circuit U and is a separate electrode that is controlled for each unit circuit U. The cathode is configured as a common electrode that is common to the unit circuits U. In addition, the cathode is connected to the constant electric potential line to which a constant electric potential is supplied. Alternatively, it may be configured that the anode is a common electrode and the cathode is a separate electrode.

The capacitor element C shown in FIG. 2 is a unit for maintaining the data electric potential VD[j] supplied from the data line 104. As shown in FIG. 2, the capacitor element C has a first electrode E1 connected to a capacitor line 106 and a second electrode E2 connected to the data line 104. The capacitor line 106 to which a constant electric potential is supplied is commonly connected to the unit circuits U. Instead of supplying the ground electric potential to the constant electric potential line, for example, it may be configured that a negative electric potential is supplied to the constant electric potential line, the data electric potential VD[N], which represent the highest luminance, of the data electric potentials VD[j] is the constant electric potential, and the data electric potential VD[1], which represents the lowest luminance, of the data electric potentials VD[j] is a negative electric potential. In other words, the ground electric potential may be positioned between the data electric potential VD[N] and the data electric potential VD[1]. In such a case, the amplitude of the data electric potential VD[j] with respect to the ground electric potential can decrease, and accordingly, low power consumption can be achieved.

The N-channel-type transistor Tr shown in FIG. 2 is a switching element that is in a conductive state at a time when the scanning line 102 is selected, so that the second electrode E2 of the capacitor element C and the electro-optical element 12 are in a conductive state. As shown in FIG. 2, the source of the transistor Tr is connected to the anode of the electro-optical element 12, and the drain of the transistor is connected to the data line 104 and the second electrode E2 of the capacitor element C. In addition, the gate of the transistor Tr is connected to the scanning line 102. When the scanning signal G[i] transits to an active state, the transistor Tr is in the ON state, and thereby the second electrode E2 and the electro-optical element 12 are in a conductive state. On the other hand, when the scanning signal G[i] transits to a non-active state, the transistor Tr is in the OFF state, and accordingly, the second electrode E2 and the electro-optical element 12 are in a non-conductive state.

Figure 3:
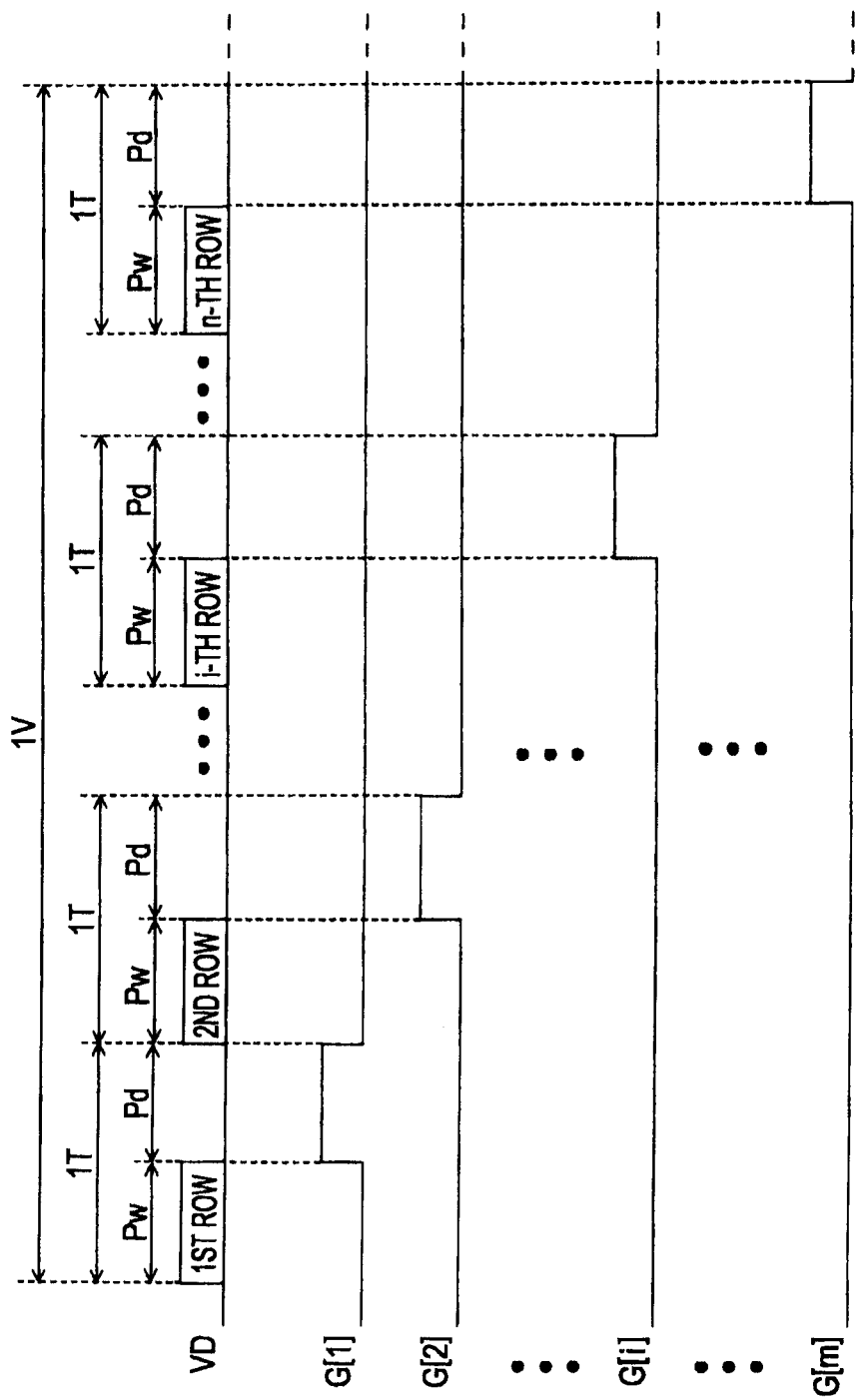
FIG. 3 is a diagram showing the operation for driving the electro-optical device.

Next, the operation of the electro-optical device 10 will be described. As shown in FIG. 3, each unit period 1T of one vertical scanning period 1V has a write period Pw that is a time period from a start time point of the unit period 1T to a time point when a predetermined time period elapses and a drive period Pd that is a time period after the write period Pw. In this embodiment, the drive period Pd is set as a time period from an end time point of the write period Pw to an end time point of the unit period 1T.

The scanning line driving circuit 20 shown in FIG. 1 sequentially selects one scanning line 102 at a time for each drive period Pd within one unit period 1T. For example, in the i-th unit period 1T within one vertical scanning period 1V, the scanning signal G[i] is set to have the active level, and accordingly, the scanning line 102 of the i-th row is selected.

The data line driving circuit 30 shown in FIG. 1 outputs a data electric potential VD corresponding to the gray scale data of the electro-optical element 12 of each unit circuit U corresponding to the scanning line 102 that is selected by the scanning line driving circuit 20 in the drive period Pd within each unit period 1T to each data line 104 for the write period Pw within the each unit period 1T. For example, in the write period Pw within the i-th unit period 1T of one vertical scanning period 1V, data electric potentials VD[1] to VD[n] corresponding to gray scale data of n unit circuits U of the i-th row are output to the data lines 104. Hereinafter, the operation for driving the electro-optical element 12 will be described separately for the write period Pw and the drive period Pd with the unit circuits U of the i-th row focused.

Write Period Pw

In the write period Pw, electric charges corresponding to the data electric potentials VD that are in correspondence with the gray scale data of the unit circuits U of the i-th row are charged (accumulated) in the capacitor elements C of the unit circuits U. For example, electric charges corresponding to the data electric potential VD[j] that is in correspondence with the gray scale data of the j-th unit circuit U of the i-th row are charged in m capacitor elements C connected to the j-th data line 104 in a parallel manner.

Drive Period Pd

Figure 4:
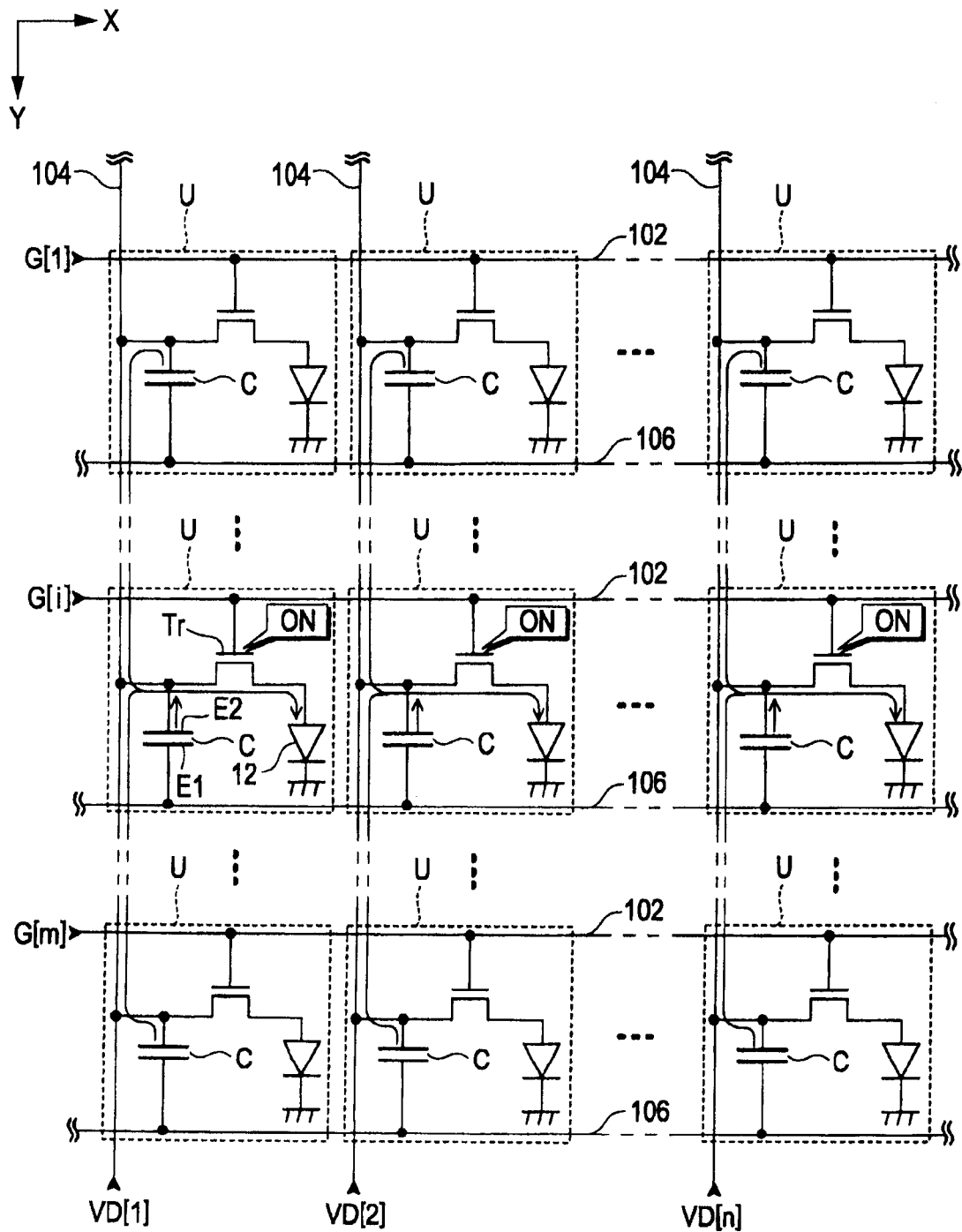
FIG. 4 is a diagram showing the operation in a write period.

In the drive period Pd, output terminals of the data line driving circuit 30 are set to be in the high-impedance state, and the scanning signal G[i] transits to the high level as shown in FIG. 3. Thus, as shown in FIG. 4, the transistors Tr of the unit circuits U of the i-th row are in the ON state. Accordingly, the electric charges charged in the write period Pw are supplied to each unit circuit U of the i-th row from the plurality of the capacitor elements C that are connected to the data line 104 corresponding to the unit circuit U. For example, to the electro-optical element 12 disposed in the j-th unit circuit U of the i-th row, electric charges that are charged in the write period Pw are simultaneously supplied from m capacitor elements C connected to the j-th data line 104. Accordingly, the electro-optical elements 12 of the unit circuits U of the i-th row emit light at gray scale levels corresponding to the data electric potentials VD.

Under the configuration according to this embodiment, in the drive period Pd within each unit period 1T, to each unit circuit U corresponding to the scanning line 102 selected by the scanning line driving circuit 20, electric charges charged in the write period Pw of the unit period 1T are simultaneously supplied from the capacitor elements C connected to the data line 104 that is in correspondence with the unit circuit U. In other words, the electric charges charged in the m capacitor elements C in the parallel manner can be used for light emission of one electro-optical element 12, and accordingly, a time for light emission of the electro-optical element 12 can be sufficiently acquired. As a result, according to this embodiment, the amount of light emission of each electro-optical element 12 can be a sufficient value, and capacitance required for the capacitor element C of each unit circuit U can be lowered, compared to that of a general case.

Second Embodiment

Figure 5:
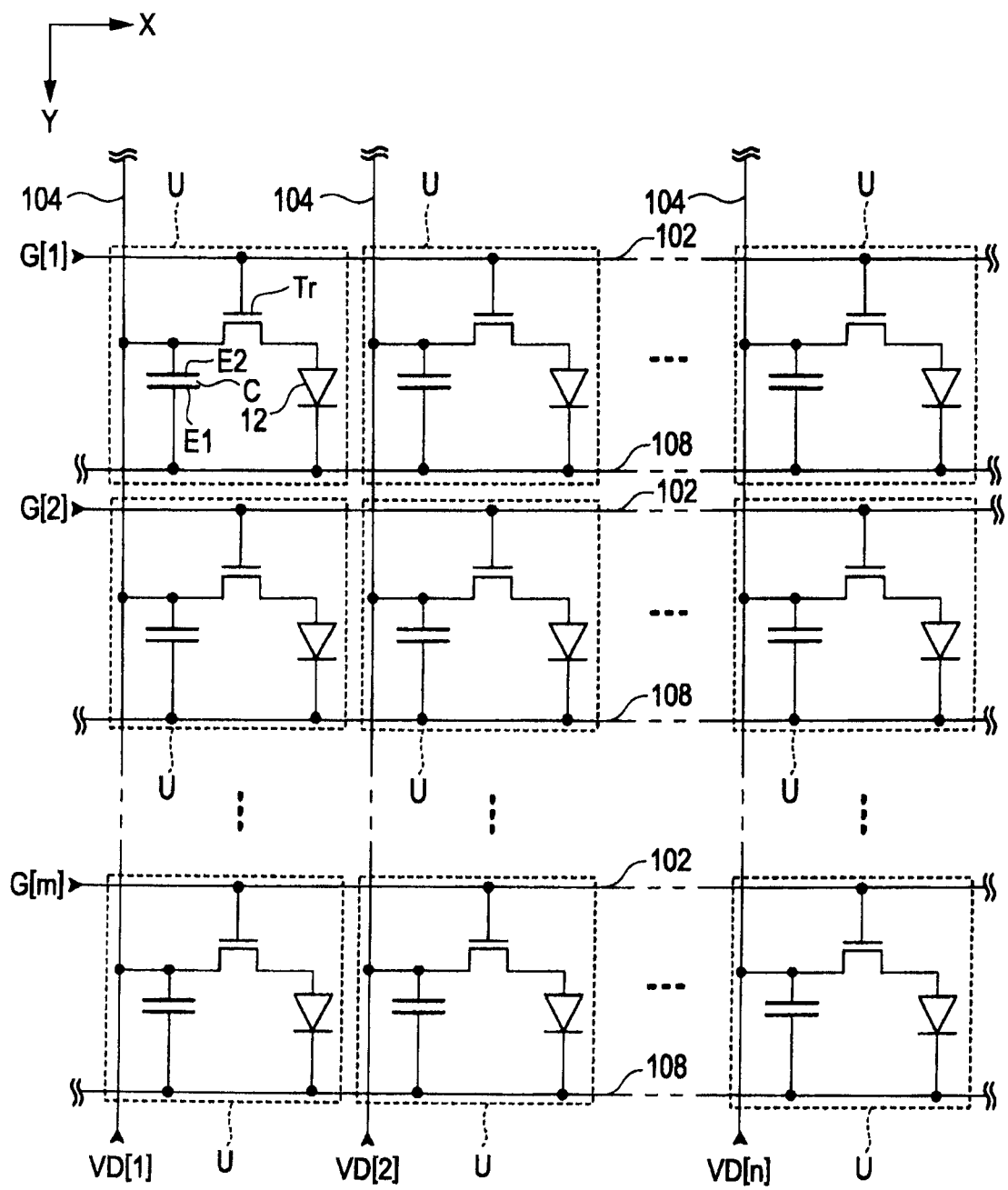
FIG. 5 is a circuit diagram showing the configuration of an electro-optical device according to a second embodiment of the invention.

FIG. 5 is a circuit diagram showing the configuration of an electro-optical device 10 according to a second embodiment of the invention. In this embodiment, the constant electric potential line additionally serves as the capacitor line 106, which is different from the configuration of the first embodiment. Described in more details, as shown in FIG. 5, to the constant electric potential line 108 that is commonly connected to the unit circuits U, the cathodes of the electro-optical elements 12 of the unit circuits U are commonly connected, and the first electrodes E1 of the capacitor elements C of the unit circuits U are commonly connected the constant electric potential line. According to this configuration, the capacitor line 106 is not needed in addition to the constant electric potential line 108. Therefore, the configuration of the electro-optical device 10 can be simplified.

Third Embodiment

Figure 6:
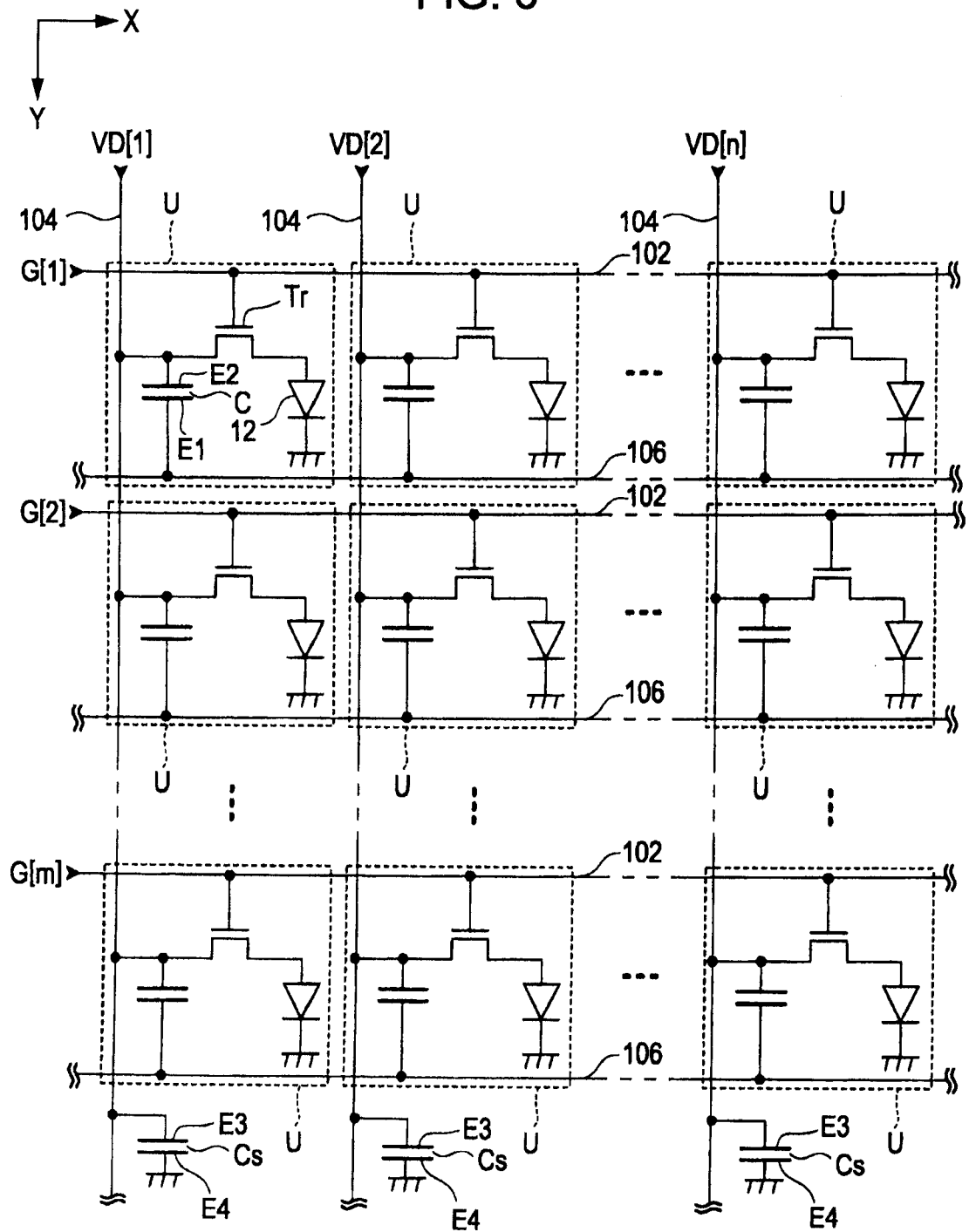
FIG. 6 is a circuit diagram showing the configuration of an electro-optical device according to a third embodiment of the invention.

FIG. 6 is a circuit diagram showing the configuration of an electro-optical device 10 according to a third embodiment of the invention. According to this embodiment, in addition to the capacitor element C of each unit circuit U, an auxiliary capacitor element Cs having one electrode connected to the data line 104 is disposed, which is different from the configuration of each of the above-described embodiments. Other configurations are the same as those of the above-described embodiments, and thus, descriptions of duplicate parts thereof are omitted here.

As shown in FIG. 6, one electrode E3 of the auxiliary capacitor element Cs is connected to the data line 104, and the other electrode E4 thereof is connected to the electric potential line to which a constant electric potential is supplied. According to this embodiment, in the write period Pw of each unit period 1T, the auxiliary capacitor element Cs is also charged. In addition, in the drive period Pd of each unit period 1T, electric charges transferred from the auxiliary capacitor element Cs are supplied to the unit circuit U corresponding to the auxiliary capacitor element Cs. Here, the electric potential line, for example, may be the capacitor line 106 shown in FIG. 2 or the constant electric potential line 108 shown in FIG. 5.

According to this embodiment, even when the sum of capacitance of the m capacitor elements C that is connected to the data line 104 corresponding to one electro-optical element 12 is insufficient for a sufficient amount of light emission of the electro-optical element 12, the lacking amount can be supplemented by using the capacitance of the auxiliary capacitor element Cs connected to the data line 104.

Fourth Embodiment

Figure 7:
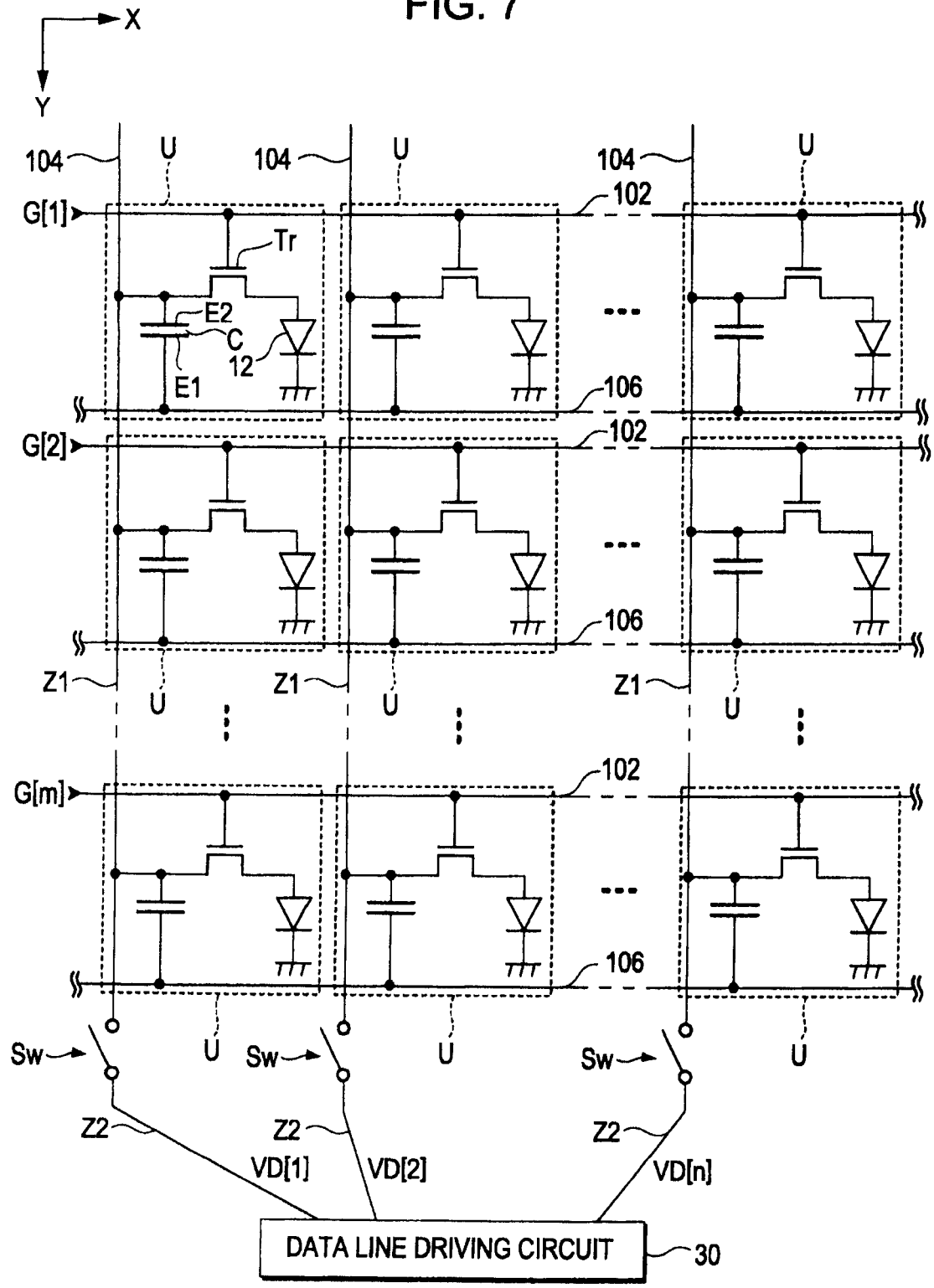
FIG. 7 is a circuit diagram showing the configuration of an electro-optical device according to a fourth embodiment of the invention.

FIG. 7 is a circuit diagram showing the configuration of an electro-optical device 10 according to a fourth embodiment of the invention. As shown in FIG. 7, according to this embodiment, each data line 104 is connected to m unit circuits U and is configured by a first part Z1 having a same length for each data line 104 and a second part Z2 connected to the data line driving circuit 30. According to this embodiment, the data line driving circuit 30 is disposed in the center of the pixel array unit 100 in direction X, and each data line 104 is bent so as to be connected to the data line driving circuit 30. The range of the pixel array unit 100 in which the data lines 104 are distributed in direction X is broader than the range in which the output terminals of the data lines 104 are distributed in the data line driving circuit 30, and accordingly, lengths of the data lines 104 are different from one another. The first parts Z1 of the data lines 104 have a same length, and thus, the lengths of the second parts Z2 of the data lines 104 are different from one another.

As shown in FIG. 7, between the first part Z1 and the second part Z2 of each data line 104, a switch Sw that is used for switching the first and second parts between a conductive state and a non-conductive state is disposed. The switches Sw are controlled to be in the ON state or the OFF state all together by a control circuit not shown in the figure. The other configurations are the same as those of each of the above-described embodiments.

Figure 8:
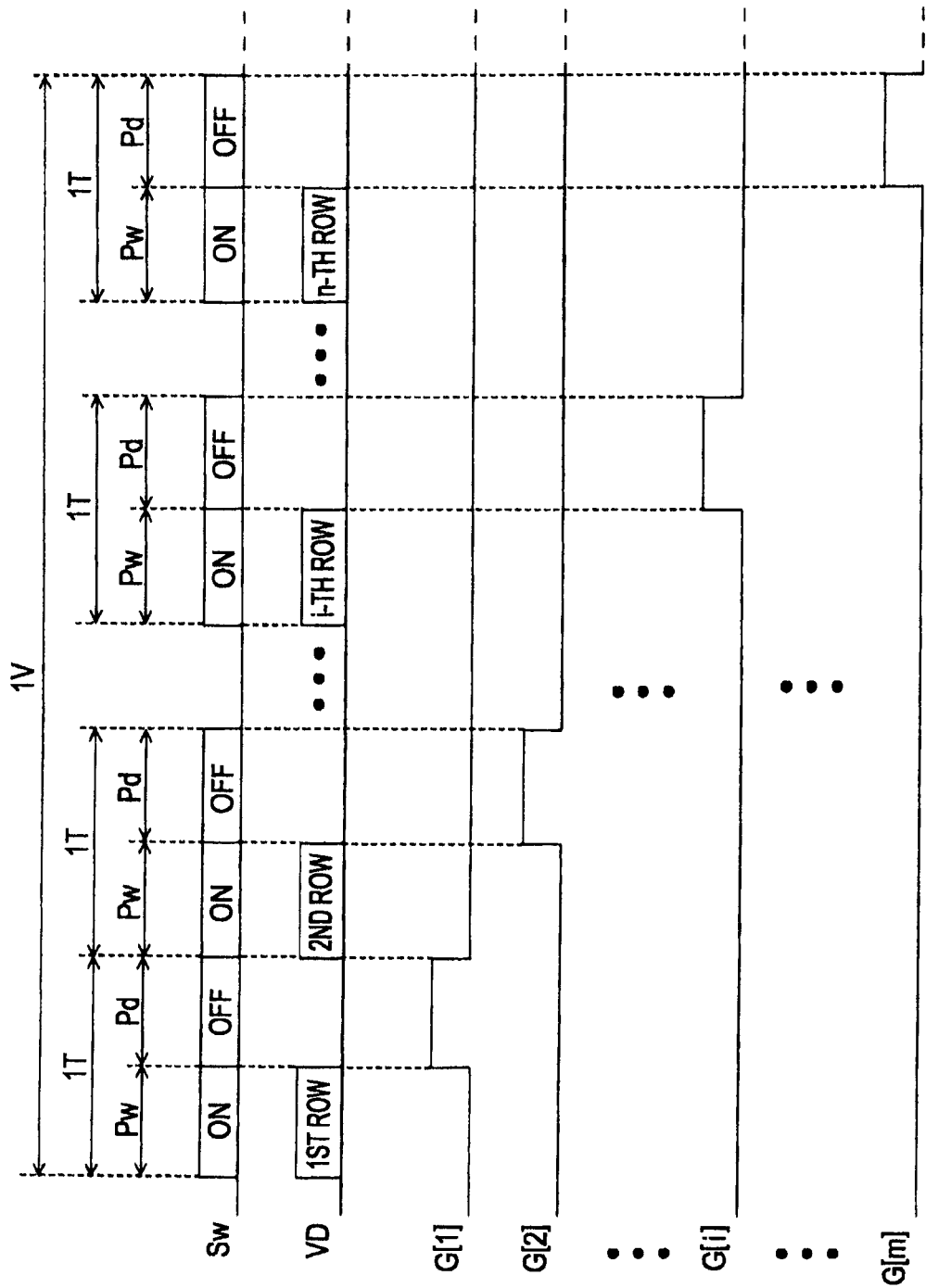
FIG. 8 is a diagram showing the operation timing of the electro-optical device according to the fourth embodiment.

As shown in FIG. 8, the switch Sw is in the ON state for each write period Pw of one unit period 1T and is in the OFF state for each drive period Pd of the unit period 1T. Described in more details, in the write period Pw, the switches Sw are in the ON state all together, and the data lines 104 and the data line driving circuit 30 are in the conductive state. Accordingly, electric charges corresponding to the data electric potentials VD output from the data line driving circuit 30 are supplied to the data lines 104. On the other hand, in the drive period Pd, the switches Sw are in the OFF state all together, and the data lines 104 and the data line driving circuit 30 are in the non-conductive state. Accordingly, supply of the electric charges corresponding to the data electric potentials VD to the data lines 104 from the data line driving circuit 30 is stopped.

Figure 9:
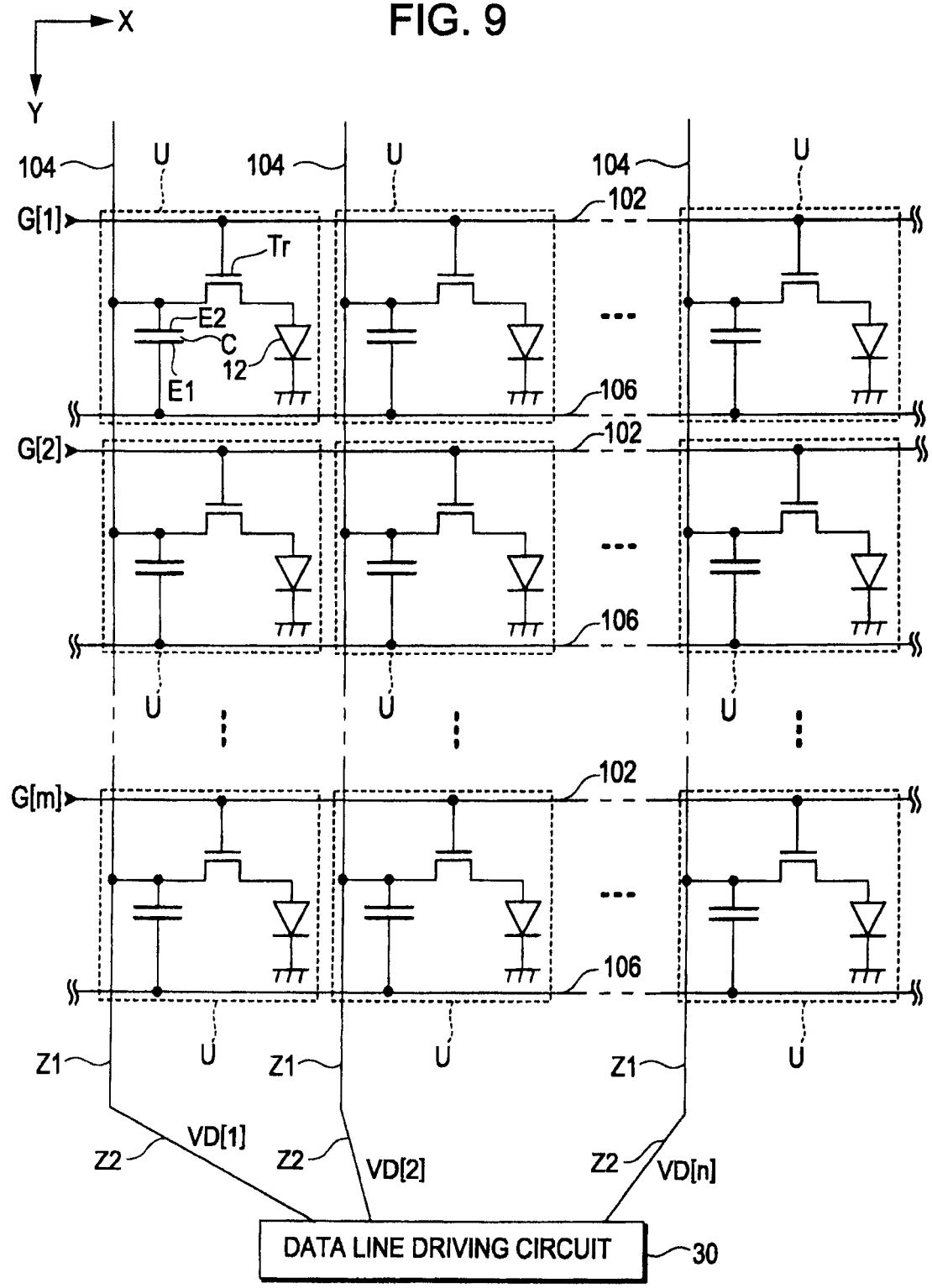
FIG. 9 is a circuit diagram showing the configuration of a comparative example.

FIG. 9 is a circuit diagram showing the configuration (hereinafter, referred to as a comparative example) in which the switch Sw is not disposed in each data line 104 and the first part Z1 and the second part Z2 are connected continuously. Generally, in each data line 104, parasitic capacitance not shown in the figure is included. As described above, the lengths of the second parts Z2 of the data lines 104 are different from one another. Thus, under the configuration of the comparative example, values of the parasitic capacitance of the data lines 104 are unbalanced. Accordingly, there is a problem that the amounts of light emission of the electro-optical elements 12 disperse for the data lines 104. On the other hand, according to this embodiment, the second parts Z2 having different lengths for the data lines 104 are separated from the data lines 104 in the drive period Pd. The lengths of the first parts Z1 of the data lines 104 are the same. Thus, for example, when the gray scale data of each unit circuit U of the row selected in the drive period Pd is the same, the electric charges supplied to the electro-optical elements 12 of the unit circuits U of the row are uniform. In other words, according to this embodiment, there is an advantage that dispersion of the amounts of light emission of the electro-optical elements 12 for the data lines 104 can be suppressed.

Fifth Embodiment

FIG. 10 is a circuit diagram showing the configuration of an electro-optical device 10 according to a fifth embodiment of the invention. In this embodiment, the capacitor element C is not disposed in each unit circuit U, which is different from the above-described embodiments.

As shown in FIG. 10, each unit circuit U has an electro-optical element 12 and a transistor Tr. The transistor Tr is disposed between a data line 104 and the electro-optical element 12 and is a unit that is in a conductive state at a time when a scanning line 102 is selected for making the data line and the electro-optical element to be in a conductive state. In addition, as shown in FIG. 10, each of n data lines has a first part Z1 to which m unit circuits U are connected, a second part Z2 that is connected to a data line driving circuit 30, and a switch Sw that is interposed between the first part Z1 and the second part Z2. Each switch Sw is in a conductive state for each write period Pw so as to make the first part Z1 and the second part Z2 to be in a conductive state. On the other hand, each switch Sw is in a non-conductive state for each drive period Pd so as to make the first part Z1 and the second part Z2 to be in a non-conductive state. The switches Sw, as in the fourth embodiment, are controlled to be in the ON state or the OFF state all together by a control circuit not shown in the figure.

The operation of the electro-optical device 10 according to this embodiment is the same as that according to the fourth embodiment. As shown in FIG. 8, in the write period Pw of each unit period 1T, the switches Sw are in the ON state all together. Accordingly, the data lines 104 and the data line driving circuit 30 are in the conductive state, and thereby data electric potentials VD[1] to VD[n] output from the data line driving circuit 30 are supplied to the data lines 104. For example, in the write period Pw of the i-th unit period 1T of one vertical scanning period 1V, the data electric potentials VD[1] to VD[n] corresponding to each gray scale data of the n unit circuits U that are selected in the drive period Pd of the i-th unit period 1T are supplied to the data lines 104. Accordingly, electric charges corresponding to the data electric potentials VD[1] to VD[n] are charged in capacitance (parasitic capacitance) that is accompanied in each data line 104.

Here, the length of the first part Z1 of each data line 104 is sufficiently larger than that of the second part Z2, and thus the value of parasitic capacitance generated between the first part Z1 and other elements (the scanning lien 102, the power supply line, and neighbor data lines 104, and the like) is sufficiently larger that generated between the second part Z2 and other elements. Accordingly, in the write period Pw of each unit period 1T, most of the electric charges according to the data electric potentials VD[1] to VD[n] output from the data line driving circuit 30 are charged in the capacitance accompanied in the first part Z1 of the data lines 104.

As shown in FIG. 8, in the drive period Pd, the switches Sw are in the OFF state all together. Accordingly, the first part Z1 of each data line 104 is electrically separated from the data line driving circuit 30, and supply of the data electric potentials VD[1] to VD[n] from the data line driving circuit 30 to the data lines 104 is stopped. In addition, one scanning line 102 is selected by the scanning line driving circuit 20. To the electro-optical elements 12 of the unit circuits U corresponding to the selected scanning line 102, the electric charges charged in the write period Pw are supplied from the capacitance accompanied by the first parts Z1 of the data lines 104 corresponding to the unit circuits U.

Under the configuration of this embodiment, the electric charges charged in the capacitance accompanied in one data line 104 can be used for light emission of one electro-optical element 12. Accordingly, differently from the above-described embodiments, the capacitor element is not needed to be disposed in each unit circuit U. As a result, according to this embodiment, there is an advantage that high precision can be achieved, compared to a case where the configuration in which the capacitor element is disposed in each unit circuit U is used.

In addition, in this embodiment, as in the above-described fourth embodiment, the lengths of the first parts Z1 of the data lines 104 may be configured to be the same. Under such a configuration, the values of capacitance accompanied by the first parts Z1 of the data lines 104 can be uniform, and electric charges supplied to the electro-optical elements 12 of the unit circuits U of a row are uniform in a case where gray scale data of the unit circuits U of the row selected in the drive period Pd is the same. In other words, there is an advantage that dispersion of the amounts of light emission of the electro-optical elements 12 for the data lines 104 can be suppressed.

Detailed Structure of Unit Circuit U of Electro-Optical Device

Next, a detailed structure of the unit circuit U of the above-described electro-optical device 10 will be described with reference to the accompanying drawings. In the drawings described below, for the convenience of description, the size and ratios of each element are appropriately changed from those of an actual device.

Structure of Unit Circuit According to First Embodiment

Figure 13:
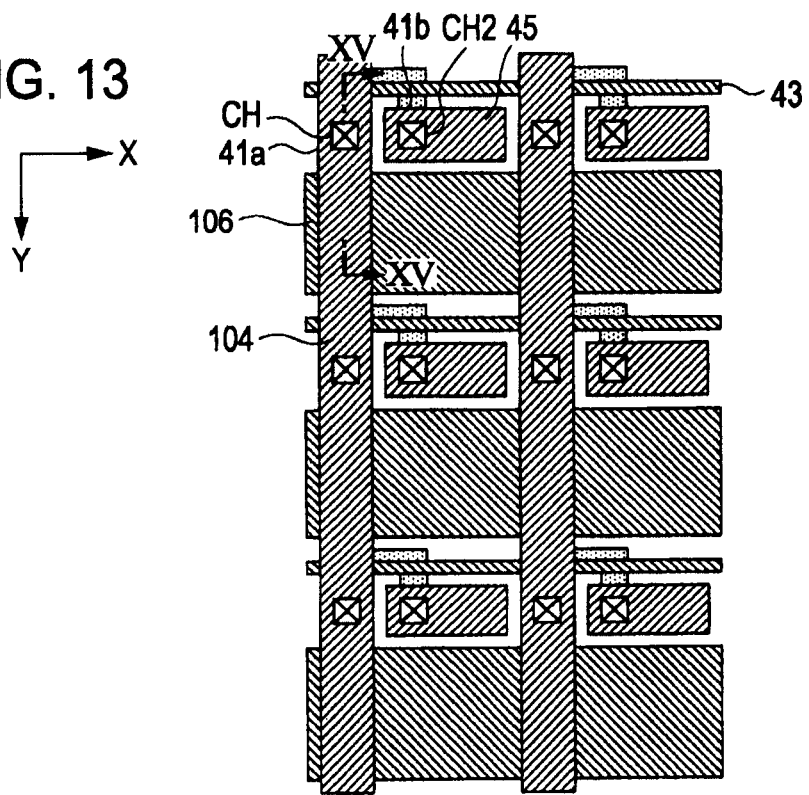
FIG. 13 is a plan view of the unit circuit of the electro-optical device according to the first embodiment in a step of the manufacturing process.
Figure 14:
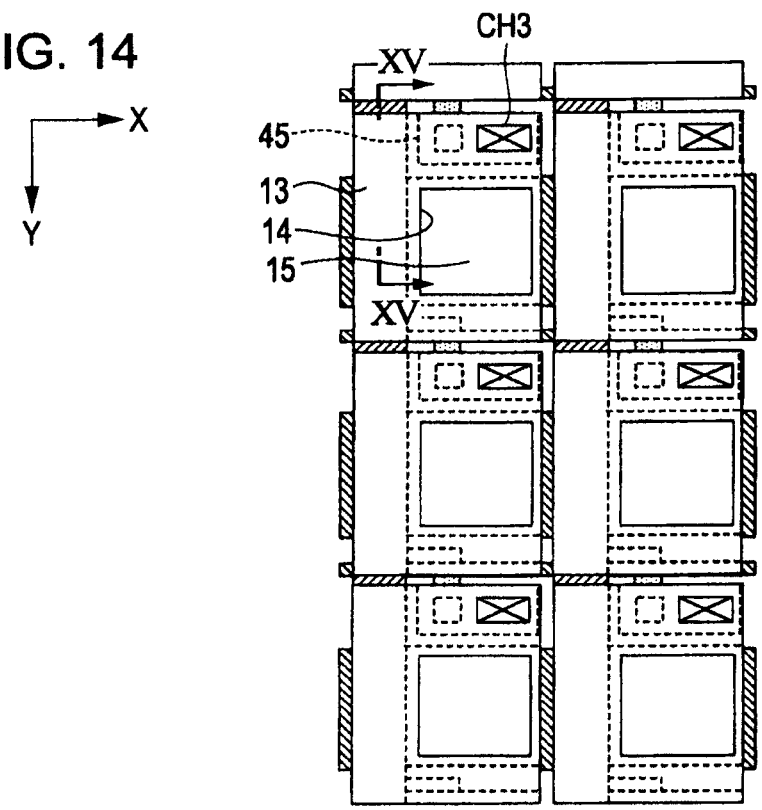
FIG. 14 is a plan view of the unit circuit of the electro-optical device according to the first embodiment in a step of the manufacturing process.
Figure 15:
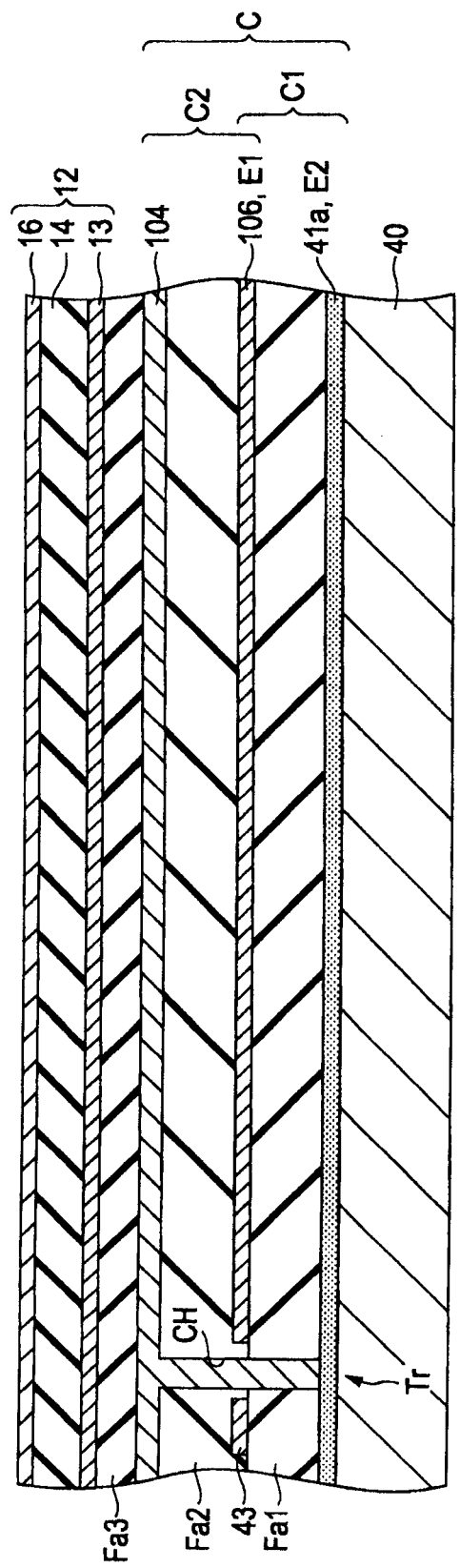
FIG. 15 is a cross-section view taken along line XV-XV shown in FIGS. 11 to 14.

FIGS. 11 to 14 are plan views showing appearances of each step in which the unit circuit U of the electro-optical device 10 according to the first embodiment is formed. In the plan views shown in FIGS. 11 to 14, six unit circuits U in each stage are arranged in the direction X and the direction Y. FIG. 15 is a cross-section view taken along line XV-XV shown in FIGS. 11 to 14. Although FIGS. 11 to 14 are plan views, for easy understanding of each element, to each element common to that shown in FIG. 15, a same hatching pattern as that shown in FIG. 15 is appropriately used.

As shown in FIGS. 11 and 15, on the face of a substrate 40, a semiconductor layer 41 formed of a semiconductor material such as silicon is formed. As shown in FIG. 11, the semiconductor layer 41 has a first part 41a and a second part 41b that extend in direction Y and a connection part 41c that extends in direction X and connects the first and second parts. The first part 41a serves as a drain region and also serves as a second electrode E2 of a capacitor element C of each unit circuit U. The second part 41b serves as a source region. In addition, the connection part 41c serves as a channel region. As shown in FIG. 15, the entire surface of the substrate 40 on which the semiconductor layer 41 is formed is covered with a first insulating layer Fa1.

As shown in FIGS. 12 and 15, on the face of the first insulating layer Fa1, a gate electrode 43 (scanning line 102) of the transistor Tr and a capacitor line 106 are formed. The gate electrode 43 and the capacitor line 106 are formed together in a same process by patterning a conductive film (for example, a thin film made of aluminum) that is continuously formed over the entire area of the first insulating layer Fa1. As shown in FIG. 12, the gate electrode 43 extends in direction X and is overlapped with the connection part 41c (gate region) of the semiconductor layer 41 through the first insulating layer Fa1 (not shown in FIG. 12).

The capacitor line 106 serves as the first electrode E1 of the capacitor element C of each unit circuit U. As shown in FIG. 12, the capacitor line 106 extends in direction X and is overlapped with the first part 41a of the semiconductor layer 41 through the first insulating layer Fa1 (not shown in FIG. 12). As shown in FIG. 15, the capacitor line 106 (the first electrode E1) and the first part 41a (the second electrode E2) of the semiconductor layer 41 face each other with the first insulating layer Fa1 interposed therebetween, and thereby a capacitor C1 is formed.

As relationship between the gate electrode 43 and the capacitor line 106, forming a plurality of elements by selectively removing a common film body (regardless of a single layer or a plurality of layers) in a same process will be represented only by "forming from a same layer", hereinafter. Elements formed from the same layer are naturally made of a same material, and film thicknesses thereof are approximately the same with one another. When a configuration in which a plurality of elements is formed from a same layer is used, compared to a configuration in which the elements are formed in different layers, there is an advantage that simplification of a manufacturing process and reduction of the manufacturing cost can be achieved.

As shown in FIG. 15, the entire surface of the first insulating layer Fa1 on which the gate electrode 43 and the capacitor line 106 are formed is covered with a second insulating layer Fa2. As shown in FIGS. 13 and 15, on the face of the second insulating layer Fa2, the data line 104 is formed. The data line 104 is formed by patterning a conductive film (for example, a thin film made of aluminum) that is continuously formed over the entire area of the second insulating layer Fa2. As shown in FIG. 13, the data line 104 extends in direction Y and is overlapped with the capacitor line 106 through the second insulating layer Fa2 (not shown in FIG. 13).

As shown in FIG. 15, the data line 104 and the capacitor line 106 face each other with the second insulating layer Fa2 interposed therebetween, and thereby a capacitor C2 is formed. As shown in FIG. 15, the capacitor element C of each unit circuit U is formed by the capacitor C1 formed by bringing the first part 41a (the second electrode E2) of the semiconductor layer 41 and the capacitor line 106 (the first electrode E1) to face each other with the first insulating layer Fa1 interposed therebetween and the capacitor C2 formed by bringing the capacitor line 106 and the data line 104 to face each other with the second insulating layer Fa2 interposed therebetween. Under the configuration of this embodiment, a plurality of capacitors that are formed in the direction of lamination in each unit circuit U forms the capacitor element C, and accordingly, the capacitance value of the capacitor element C in each unit circuit U can be sufficiently acquired. This configuration is particularly effective for a case where high definition of pixels is performed and the area of a planar part in each unit circuit U decreases.

The data line 104 also serves as the drain electrode of the transistor Tr in each unit circuit U. As shown in FIGS. 13 and 15, the data line 104 and the first part 41a (the drain region) of the semiconductor layer 41 are in the conductive state through a contact hole CH.

In addition, as shown in FIG. 13, the source electrode 45 of the transistor Tr and the data line 104 are formed in a same layer, and the source electrode and the second part 41b (the source region) of the semiconductor layer 41 are in the conductive state through a contact hole CH2.

As shown in FIG. 15, the entire surface of the second insulating layer Fa2 on which the data line 104 is formed is covered with a third insulating layer Fa3. As shown in FIGS. 14 and 15, on the face of the third insulating layer Fa3, an anode 13 of the electro-optical element 12 is formed. As show in FIG. 14, the source electrode 45 of the transistor Tr and the anode 13 are in the conductive state through a contact hole CH3. As the material of the anode 13, various light-reflective conduction materials such as metal including aluminum, silver, or the like and alloy using the above-described material as a major component are used.

As shown in FIGS. 14 and 15, on the face of the third insulating layer Fa3 on which the anode 13 is formed, a partition wall 14 used for dividing each unit circuit U is formed. A light emitting layer 15 of the electro-optical element 12 is formed at least in a depression that is surrounded by the inner peripheral face of the partition wall 14 and has the anode 13 as its bottom. The light emitting element 15 may be formed on the partition wall 14. In addition, a configuration in which various function layers (a hole injecting layer, a hole transport layer, an electron injecting layer, an electron transport layer, a hole blocking layer, and an electron blocking layer) used for promoting or effectively performing the light emission of the light emitting layer 15 are laminated on the light emitting layer 15 may be used.

As shown in FIG. 15, a cathode 16 is formed so as to cover the light emitting layer 15 and the partition wall 14 of each unit circuit U. The cathode 16 is formed to be continuous over the electro-optical elements 12 of the unit circuits U. The cathode 16 is formed of a transparent conduction material such as ITO (Indium Tin Oxide) or IZO (Indium Zinc Oxide). In addition, the cathode 16 may be formed to include a material having a low work function such as alloy of Mg and Ag at a thickness for which light can be transmitted. According to this embodiment, light that is irradiated from the light emitting layer 15 to the cathode 16 side of the electro-optical element 12 and light that is irradiated to a side opposite to the cathode 16 from the light emitting layer 15, reflected from the anode 13, and forwarded toward the cathode 16 are transmitted through the cathode 16 to be output externally (top emission).

Figure 18:
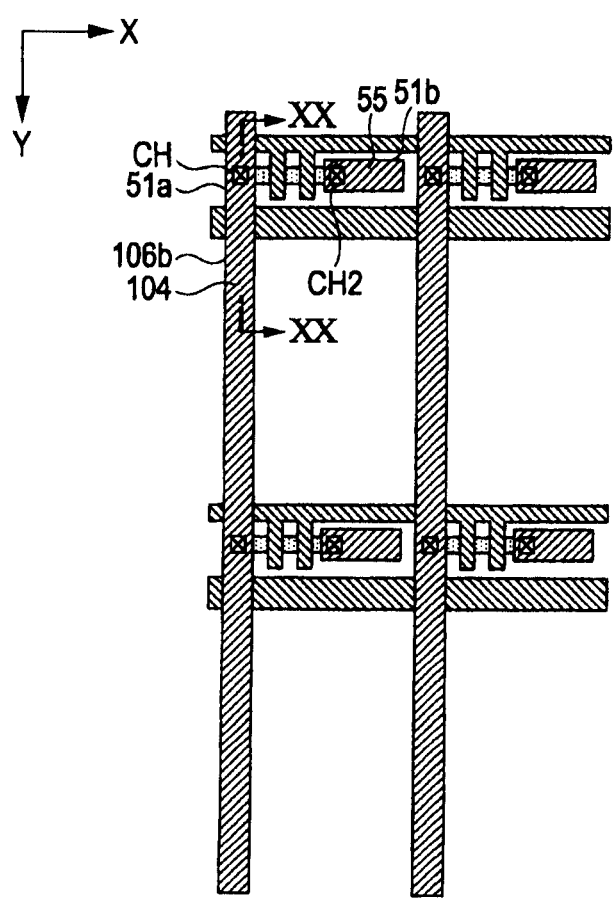
FIG. 18 is a plan view of the unit circuit of the electro-optical device according to the first embodiment in a step of the manufacturing process.
Figure 19:
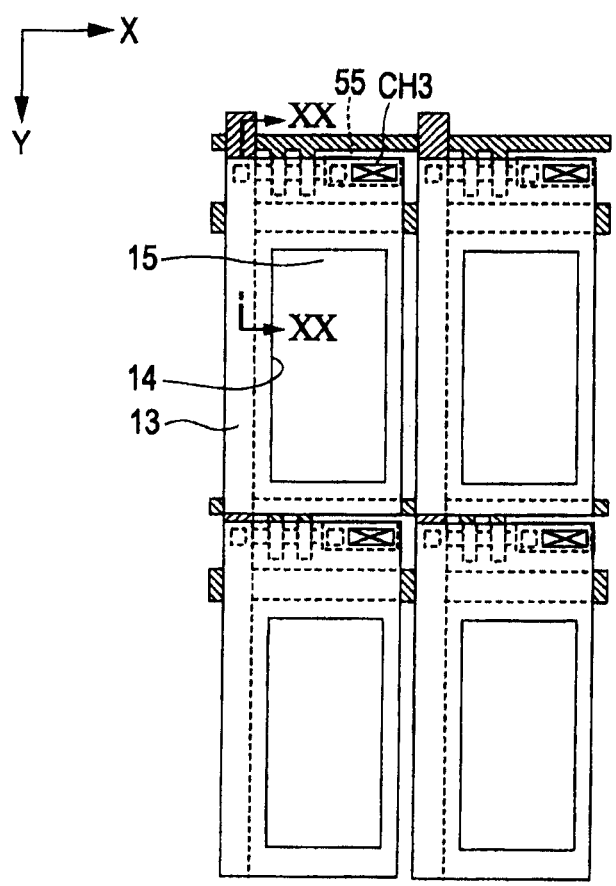
FIG. 19 is a plan view of the unit circuit of the electro-optical device according to the first embodiment in a step of the manufacturing process.
Figure 20:
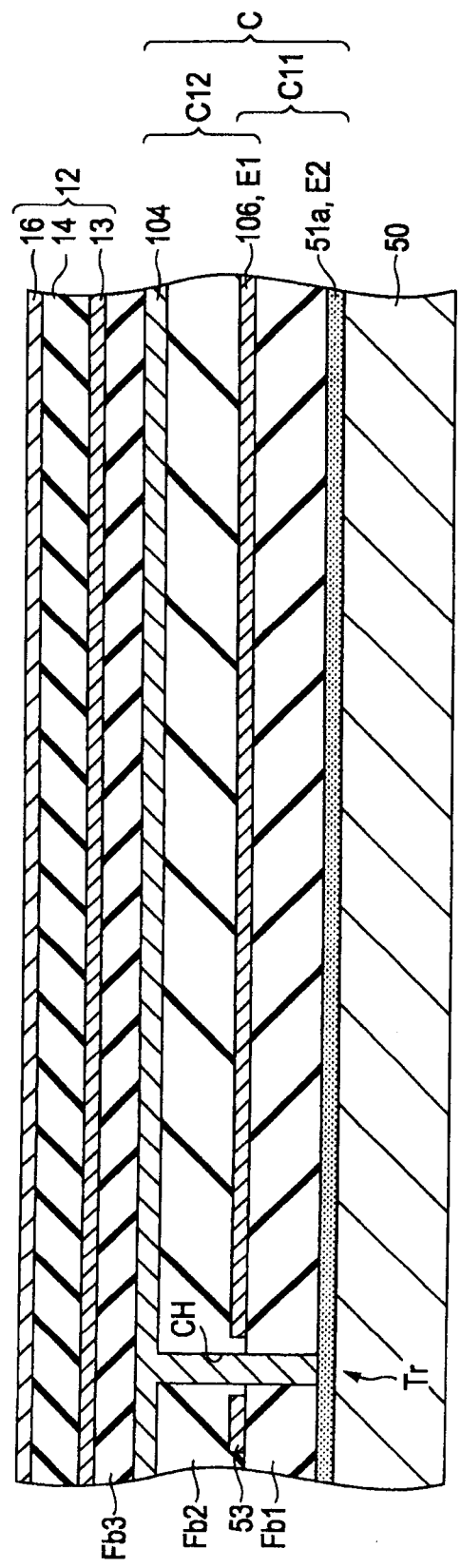
FIG. 20 is a cross section view taken along line XX-XX shown in FIGS. 16 to 19.

The electro-optical device 10 according to the first embodiment may employ a bottom-emission-type structure. FIGS. 16 to 19 are plan views showing appearances of each step in which each unit circuit U is formed in a case where the electro-optical device 10 is configured as the bottom-emission-type. FIG. 20 is a cross section view taken along line XX-XX shown in FIGS. 16 to 19.

As shown in FIGS. 16 and 20, on the face of a substrate 50, a semiconductor layer 51 is formed of a semiconductor material such as silicon. As shown in FIG. 16, the semiconductor layer 51 has a first part 51a that extends in direction Y and a second part 51b that extends in direction X. The first part 51a serves as a drain region of the transistor Tr and also serves as a second electrode E2 of a capacitor element C. The second part 51b serves as a channel region and a source region. As shown in FIG. 20, the entire surface of the substrate 50 on which the semiconductor layer 51 is formed is covered with a first insulating layer Fb1.

As shown in FIGS. 17 and 20, on the face of the first insulating layer Fb1, a gate electrode 53 (scanning line 102) of a transistor Tr and a capacitor line 106 are formed. The gate electrode 53 and the capacitor line 106 are formed in a same layer. As shown in FIG. 17, the gate electrode 53 has a first part 53a that extends in direction X and a second part 53b that extends in direction Y. The first part 53a serves as a scanning line 102. The second part 53b is overlapped with the second part 51b (channel region) of the semiconductor layer 51 through the first insulating layer Fb1 (not shown in FIG. 17).

As show in FIG. 17, the capacitor line 106 has a first part 106a that extends in direction X and a second part 106b that extends in direction Y. As show in FIG. 17, the second part 106b of the capacitor line 106 is overlapped with the first part 51a of the semiconductor layer 51 through the first insulating layer Fb1 (not shown in FIG. 17). As shown in FIG. 20, the second part 106b (the first electrode E1) of the capacitor line 106 and the first part 51a (the second electrode E2) of the semiconductor layer 51 face each other with the first insulating layer Fb1 interposed therebetween, and thereby a capacitor C11 is formed.

As shown in FIG. 20, the entire surface of the first insulating layer Fb1 in which the gate electrode 53 and the capacitor line 106 are formed is covered with a second insulating layer Fb2. As shown in FIGS. 18 and 20, on the face of the second insulating layer Fb2, the data line 104 is formed. As shown in FIG. 18, the data line 104 extends in direction Y and is overlapped with the second part 106b of the capacitor line 106 through the second insulating layer Fb2 (not shown in FIG. 18). As shown in FIG. 20, the data line 104 and the second part 106b of the capacitor line 106 face each other with the second insulating layer Fb2 interposed therebetween, and thereby a capacitor C22 is formed. As shown in FIG. 20, the capacitor element C of each unit circuit U is formed by the capacitor C11 formed by bringing the first part 51a (the first electrode E1) of the semiconductor layer 51 and the second part 106b (the second electrode E2) of the capacitor line 106 to face each other with the first insulating layer Fb1 interposed therebetween and the capacitor C22 formed by bringing the second part 106b of the capacitor line 106 and the data line 104 to face each other with the second insulating layer Fb2 interposed therebetween.

As shown in FIGS. 18 and 20, the data line 104 and the first part 51a (the drain region) of the semiconductor layer 51 are in the conductive state through a contact hole CH. In addition, as shown in FIG. 18, the source electrode 55 of the transistor Tr and the data line 104 are formed in a same layer, and the source electrode and the second part 51b (the source region) of the semiconductor layer 51 are in the conductive state through a contact hole CH2.

As shown in FIG. 20, the entire surface of the second insulating layer Fb2 on which the data line 104 is formed is covered with a third insulating layer Fb3. As shown in FIGS. 19 and 20, on the face of the third insulating layer Fb3, an anode 13 of the electro-optical element 12 is formed. As shown in FIG. 19, the source electrode 55 of the transistor Tr and the anode 13 are in the conductive state through a contact hole CH3. The anode 13 is formed of a transparent conduction material.

As shown in FIGS. 19 and 20, on the face of the third insulating layer Fb3 on which the anode 13 is formed, a partition wall 14 is formed. A light emitting layer 15 of the electro-optical element 12 is formed at least in a depression that is surrounded by the inner peripheral face of the partition wall 14 and has the anode 13 as its bottom.

As shown in FIG. 20, a cathode 16 is formed so as to cover the light emitting layer 15 and the partition wall 14 of each unit circuit U. The cathode 16 is formed of a light-reflective conduction material. Here, the cathode 16 may be formed to include a material having light-reflectivity such as aluminum or silver and a material having a low work function such as magnesium or calcium. According to this embodiment, light that is irradiated from the light emitting layer 15 to the anode 13 side of the electro-optical element 12 and light that is irradiated to the cathode 16 side from the light emitting layer 15, reflected from the cathode 16, and forwarded toward the anode 13 are output through the anode 13 (bottom emission).
Structure of Unit Circuit According to Second Embodiment FIGS. 21 to 24 are plan views showing appearances of each step in which the unit circuit U of the electro-optical device 10 according to the second embodiment is formed. In the plan views shown in FIGS. 21 to 24, four unit circuits U in each stage are arranged in the direction X and the direction Y. FIG. 25 is a cross-section view taken along line XXV-XXV shown in FIGS. 21 to 24. Although FIGS. 21 to 24 are plan views, for easy understanding of each element, to each element common to that shown in FIG. 25, a same hatching pattern as that shown in FIG. 25 is appropriately used.

Figure 21:
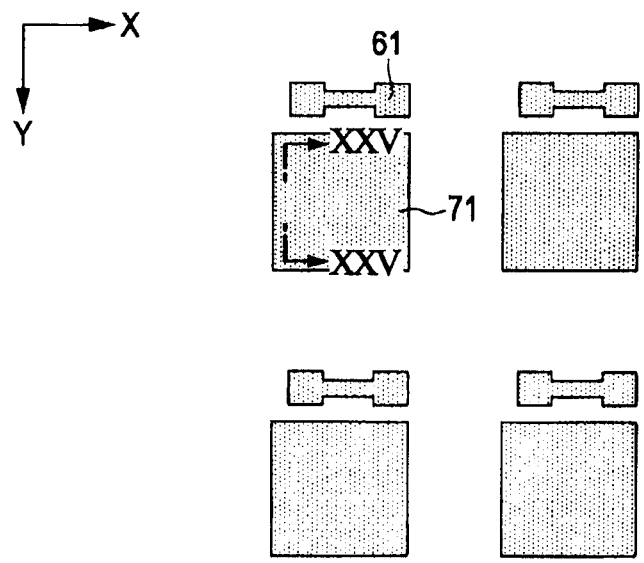
FIG. 21 is a plan view of a unit circuit of an electro-optical device according to the second embodiment in a step of a manufacturing process.

As shown in FIGS. 21 and 25, on the face of a substrate 60, semiconductor layers 61 and 71 formed of a semiconductor material such as silicon is formed. A semiconductor layer 61 extends in direction X and serves as a channel region of the transistor Tr. The semiconductor layer 71 serves as a first electrode E1 of the capacitor element C. As shown in FIG. 25, the entire surface of the substrate 60 on which the semiconductor layer 61 and the semiconductor layer 71 are formed is covered with a first insulating layer Fc1.

Figure 22:
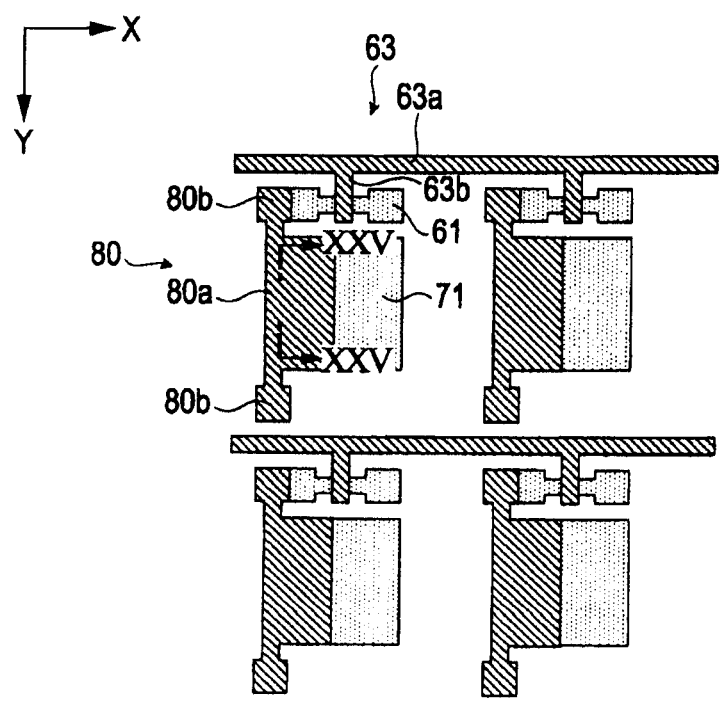
FIG. 22 is a plan view of the unit circuit of the electro-optical device according to the second embodiment in a step of the manufacturing process.

As shown in FIGS. 22 and 25, on the face of the first insulating layer Fc1, a gate electrode 63 (the scanning line 102) of the transistor Tr and a wiring 80 formed of a conductive material are formed. The gate electrode 63 and the wiring 80 are formed in a same layer. As shown in FIG. 22, the gate electrode 63 has a first part 63a that extends in direction X and a second part 63b that extends in direction Y. The first part 63a of the gate electrode 63 serves as the scanning line 102. As shown in FIG. 22, the second part 63b of the gate electrode 63 is overlapped with the semiconductor layer 61 (the channel region) through the first insulating layer Fc1 (not shown in FIG. 22).

As shown in FIG. 22, the wiring 80 has a first part 80a having a rectangular shape and second parts 80b that extend from the edges of the first part 80a to the positive and negative sides of direction Y. The first part 80a of the wiring 80 also serves as a second electrode E2 of the capacitor element C. As shown in FIG. 22, the first part 80a of the wiring 80 is overlapped with the semiconductor layer 71 (the first electrode E1). As shown in FIG. 25, the semiconductor layer 71 (the first electrode E1) and the first part 80a (the second electrode E2) of the wiring 80 face each other with the first insulating layer Fc1 interposed therebetween, and thereby a capacitor C111 is formed.

Figure 23:
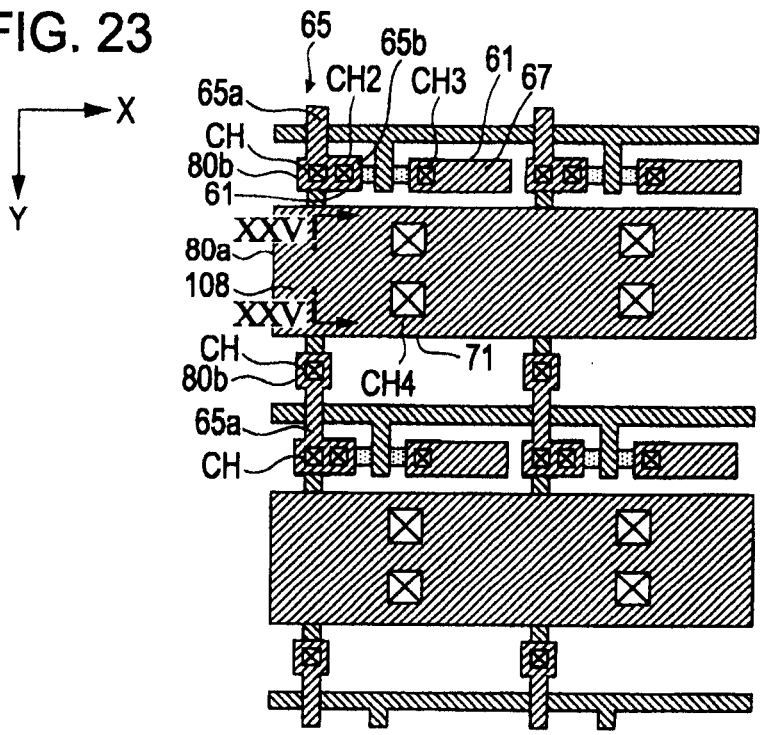
FIG. 23 is a plan view of the unit circuit of the electro-optical device according to the second embodiment in a step of the manufacturing process.

As shown in FIGS. 23 and 25, the entire surface of the first insulating layer Fc1 in which the gate electrode 63 and the wiring 80 are formed is covered with a second insulating layer Fc2. As shown in FIGS. 23 and 25, on the face of the second insulating layer Fc2, the drain electrode 65, the source electrode 67, and the constant electric potential line 108 are formed. The drain electrode 65, the source electrode 67, and the constant electric potential line 108 are formed in a same layer.

As shown in FIG. 23, the drain electrode 65 has a first part 65a that extends in direction Y and a second part 65b that extends in direction X. As shown in FIG. 23, the first part 65a of the drain electrode 65 and the second part 80b of the wiring 80 are connected together (conductive to each other) through a contact hole CH so as to form the data line 104. In addition, as shown in FIG. 23, the second part 65b of the drain electrode 65 and the semiconductor layer 61 (the drain region) are in the conductive state through a contact hole CH2.

As shown in FIG. 23, the source electrode 67 extends in direction X so as to be in the conductive state with the semiconductor layer 61 (the source region) through a contact hole CH3.

As shown in FIGS. 23 and 25, the constant electric potential line 108 that is formed of metal having low resistance extends in direction X so as to be overlapped with the first part 80a of the wiring 80. As shown in FIG. 25, the constant electric potential line 108 and the first part 80a of the wiring 80 face each other with the second insulating layer Fc2 interposed therebetween, and thereby a capacitor C222 is formed. As shown in FIG. 25, the capacitor element C of each unit circuit U is formed by the capacitor C111 formed by bringing the semiconductor layer 71 (the first electrode E1) of the semiconductor layer 71 and the first part 80a (the second electrode E2) of the wiring 80 to face each other with the first insulating layer Fc1 interposed therebetween and the capacitor C222 formed by bringing the constant electric potential line 108 and the first part 80a of the wiring 80 to face each other with the second insulating layer Fc2 interposed therebetween. In addition, as shown in FIG. 23, the constant electric potential line 108 is connected to the semiconductor layer 71 (the first electrode E1) through a contact hole CH4.

Figure 24:
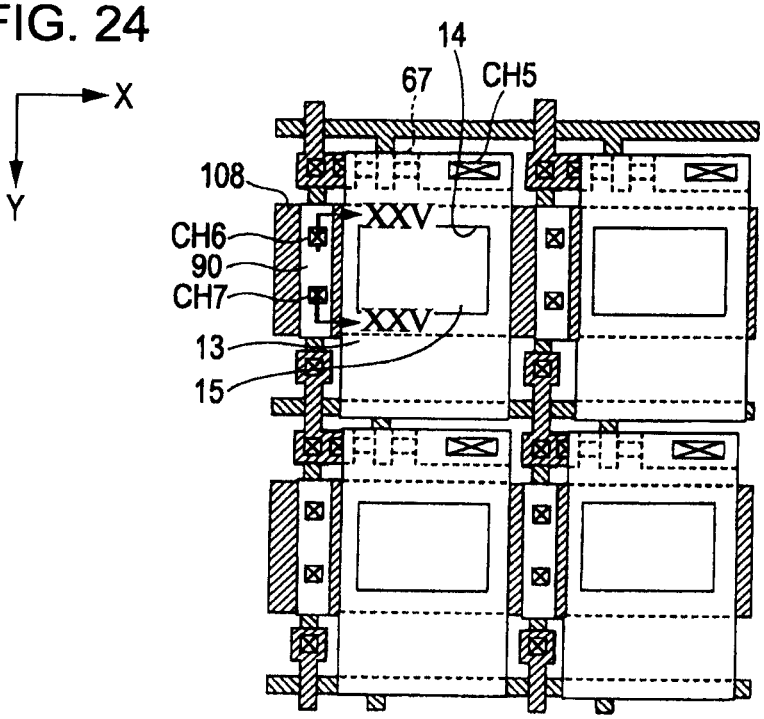
FIG. 24 is a plan view of the unit circuit of the electro-optical device according to the second embodiment in a step of the manufacturing process.
Figure 25:
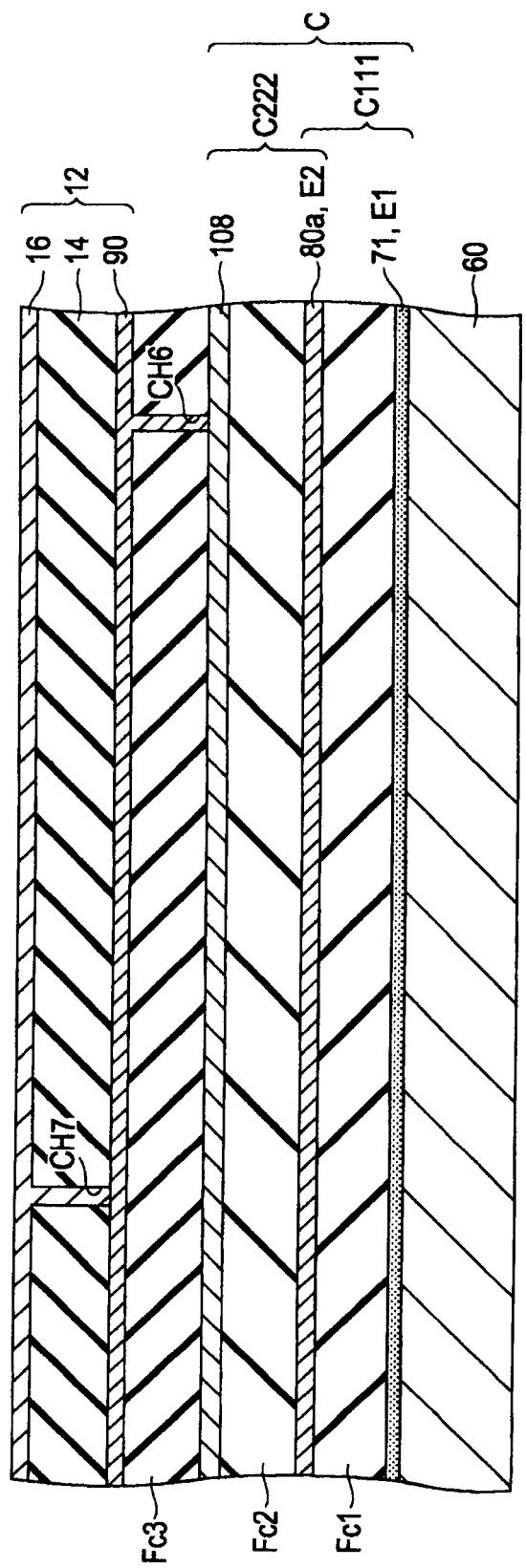
FIG. 25 is a cross-section view taken along line XXV-XXV shown in FIGS. 21 to 24.

As shown in FIGS. 24 and 25, the entire surface of the second insulating layer Fc2 on which the drain electrode 65, the source electrode 67, and the constant electric potential line 108 are formed is covered with a third insulating layer Fc3. As shown in FIGS. 24 and 25, on the face of the third insulating layer Fc3, the anode 13 of the electro-optical element 12 and an intermediate conductive layer 90 are formed. The anode 13 and the intermediate conductive layer 90 are formed in a same layer. As shown in FIG. 24, the source electrode 67 of the transistor Tr and the anode 13 are in the conductive state through a contact hole CH5. In this embodiment, the anode 13 is formed of a light-reflective conduction material. In addition, as shown in FIGS. 24 and 25, the constant electric potential line 108 and the intermediate conductive layer 90 are in the conductive state through a contact hole CH6.

As shown in FIGS. 24 and 25, on the face of the third insulating layer Fc3 on which the anode 13 and the intermediate conductive layer 90 are formed, a partition wall 14 is formed. A light emitting layer 15 of the electro-optical element 12 is formed in the shape of a depression that is surrounded by the inner peripheral face of the partition wall 14 and has the anode 13 as its bottom.

As shown in FIG. 25, the cathode 16 is formed so as to cover the anode 13 (not shown in FIG. 25), the partition wall 14, and the intermediate conductive layer 90 of each unit circuit U. The cathode 16 is formed to be continuous over the electro-optical elements 12 of the unit circuits U. As shown in FIGS. 24 and 25, the cathode 16 is in a conductive state with the intermediate conductive layer 90 through a contact hole CH7.

Thus, the constant electric potential line 108 not only serves as one electrode of the capacitor element C but also serves as an auxiliary electrode used for decreasing the resistance of the cathode 16.

In this embodiment, the cathode 16 is formed of a transparent conduction material such as ITO (Indium Tin Oxide) or IZO (Indium Zinc Oxide). According to this embodiment, light that is irradiated from the light emitting layer 15 to the cathode 16 side of the electro-optical element 12 and light that is irradiated to a side opposite to the cathode 16 from the light emitting layer 15, reflected from the anode 13, and forwarded toward the cathode 16 are transmitted through the cathode 16 to be output externally (top emission). However, the invention is not limited thereto, and a bottom-emission-type structure may be employed.

In this embodiment, the cathode 16 is formed of a high-resistance material such as ITO. However, the resistance of the cathode 16 can decrease by making the constant electric potential line 108 formed of a metal material having resistance lower than that of the cathode 16 and the cathode 16 to be in the contact state through contact holes CH6 and CH7. Accordingly, a voltage drop in the cathode 16 is suppressed. In other words, the static electric potential line 108 not only serves as the capacitor line 106 but also serves as an auxiliary wiring.

MODIFIED EXAMPLE

The present invention is not limited to the above-described embodiments. Thus, for example, modifications as below can be made therein. In addition, two or more modified examples of modified examples described below may be combined.

Modified Example 1

In each of the above-described embodiments, for example, as show in FIG. 3, a case where the end time point of the drive period Pd and the end time point of the unit period 1T are the same has been described. However, the invention is not limited thereto, and, for example, a configuration in which the drive period Pd ends before the end time point of the unit period 1T may be used. In addition, in FIG. 3, a case where the start time point of each unit period 1T and the start time point of the write period Pw of the unit period 1T are the same is exemplified. However, the invention is not limited thereto, and, for example, a configuration in which the write period Pw starts after a predetermined time elapses from the start time point of the unit period 1T may be used. In addition, in FIG. 3, a case where the end time point of the write period Pw of each unit time 1T and the start time point of the drive time Pd are the same is exemplified. However, the invention is not limited thereto, and, for example, a configuration in which the drive time Pd starts before the write time Pw ends may be used.

Modified Example 2

In the above-described third embodiment, a configuration in which the auxiliary capacitor element Cs having one electrode connected to the data line 104 is disposed in addition to the capacitor element C of each unit circuit U has been described. However, for example, a configuration, in which the auxiliary capacitor element Cs includes a plurality of capacitor elements having different capacitance values and a switching element that makes one capacitor element among the plurality of capacitor elements and the data line 104 in the conductive state is disposed between one electrode of each of the plurality of capacitor elements and the data line 104 may be used.

Figure 26:
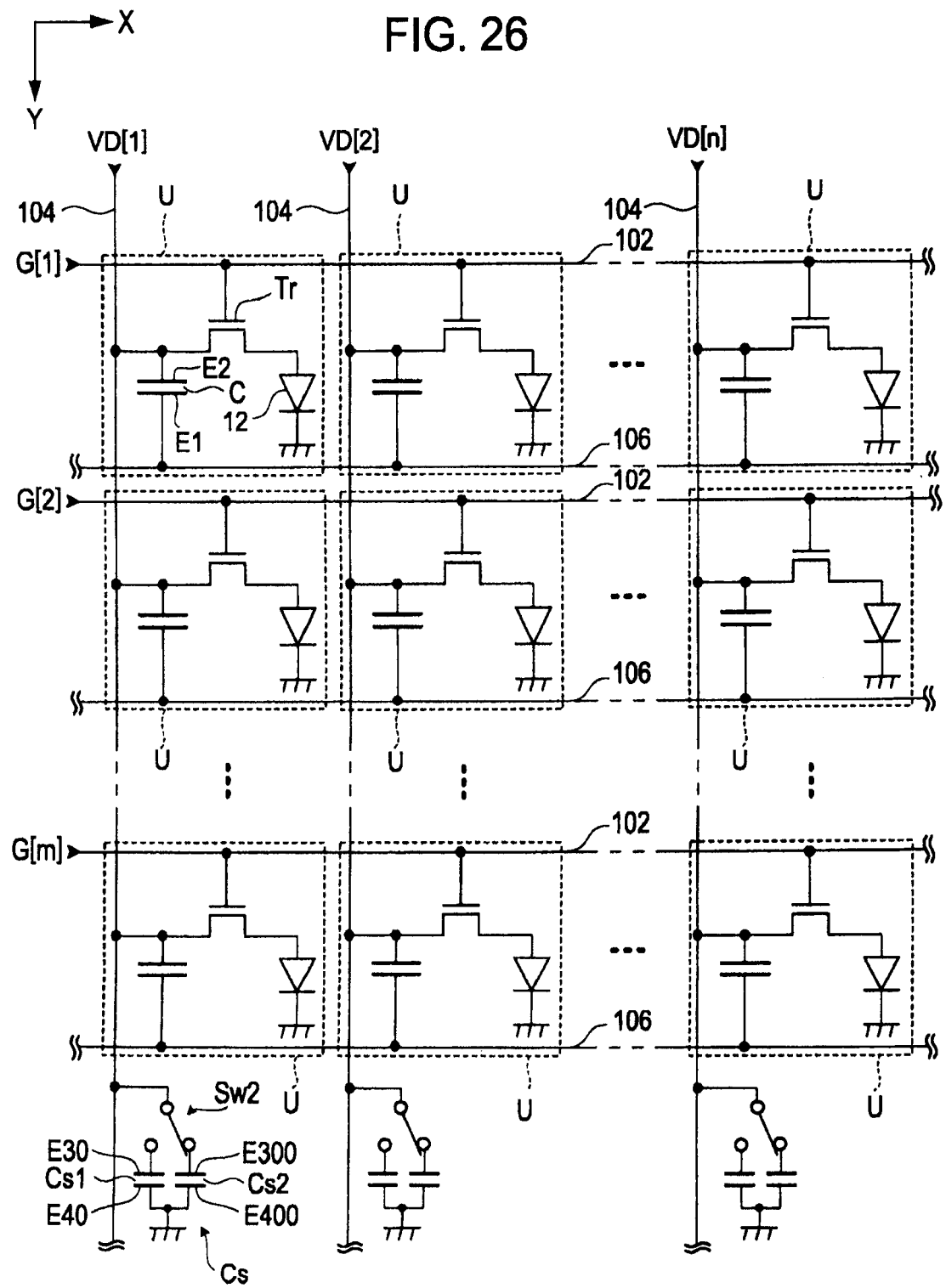
FIG. 26 is a circuit diagram showing the configuration of an electro-optical device according to modified example 2 of the invention.

FIG. 26 is a circuit diagram showing the configuration of an electro-optical device 10 according to modified example 2. As shown in FIG. 26, the auxiliary capacitor element Cs is configured by a first capacitor element Cs1 and a second capacitor element Cs2 having different capacitance values (for example, the capacitance of Cs1>the capacitance of Cs2). As shown in FIG. 26, between one electrode E30 of the first capacitor element Cs1 and one electrode E300 of the second capacitor element Cs2 and the data line 104, a switch Sw2 that makes one capacitor element between the first capacitor element Cs1 and the second capacitor element Cs2 and the data line 104 is disposed. In addition, as shown in FIG. 26, the other electrode E40 of the first capacitance Cs1 and the other electrode E400 of the second capacitor element Cs2 are connected commonly to a constant power supply line to which a constant electric potential is supplied. The constant electric potential line, for example, may be the capacitor line 106 shown in FIG. 2 or the constant electric potential line 108 shown in FIG. 5.

The switch Sw2 is controlled by a control circuit not shown in the figure. In the write period Pw of each unit period 1T, one between the first capacitor element Cs1 and the second capacitor element Cs2 is selected by the switch Sw2 to be conductive to the data line 104, and the selected capacitor element is charged. Then, in the drive period Pd of each unit period 1T, electric charges from the capacitor element is supplied to a corresponding unit circuit U. Under the configuration shown in FIG. 26, by selectively making one of the plurality of capacitor elements to be conductive to the data line 104 in the write period Pw, an emission time of the electro-optical element 12 can be controlled. Accordingly, the amount of light emission of the electro-optical element 12 can be controlled at a plurality of levels.

In the configuration shown in FIG. 26, a case where the auxiliary capacitor element Cs is configured by the first capacitor element Cs1 and the second capacitor element Cs2 has been exemplified. However, the invention is not limited thereto, and the auxiliary capacitor element Cs is needed to include a plurality of capacitor elements having different capacitance values. For example, the auxiliary capacitor element Cs may be configured by three capacitor elements having three different capacitance values. As the number of the capacitor elements having different capacitance values increases, there is an advantage that the capacitance value can be more delicately controlled.

Modified Example 3

In each of the above-described embodiments, the transistor Tr of each unit circuit U is the N-channel type transistor. However, the invention is not limited thereto, and the transistor may be configured by a P-channel type transistor. For example, the transistor Tr is configured as a switching element to be conductive at a time when the scanning line 102 is selected for making the second electrode E2 of the capacitor element C and the electro-optical element 12 to be in the conductive state.

Modified Example 4

In the above-described fourth embodiment, in each data line 104, the switch Sw used for switching between conduction and non-conduction of the first and second parts is disposed between the first part Z1 and the second part Z2. For example, the switch Sw may be configured by a thin film transistor, an N-channel type transistor, or a P-channel type transistor.

Modified Example 5

In each of the above-described embodiments, as one example of the electro-optical element 12, an OLED has been described. However, as the electro-optical element, an organic light emitting diode or an LED (Light Emitting Diode) may be used. In other words, an element of any type may be used as the electro-optical element as long as the element emits light at a light-emission luminance level corresponding to an electrical energy level.

Modified Example 6

Figure 27:
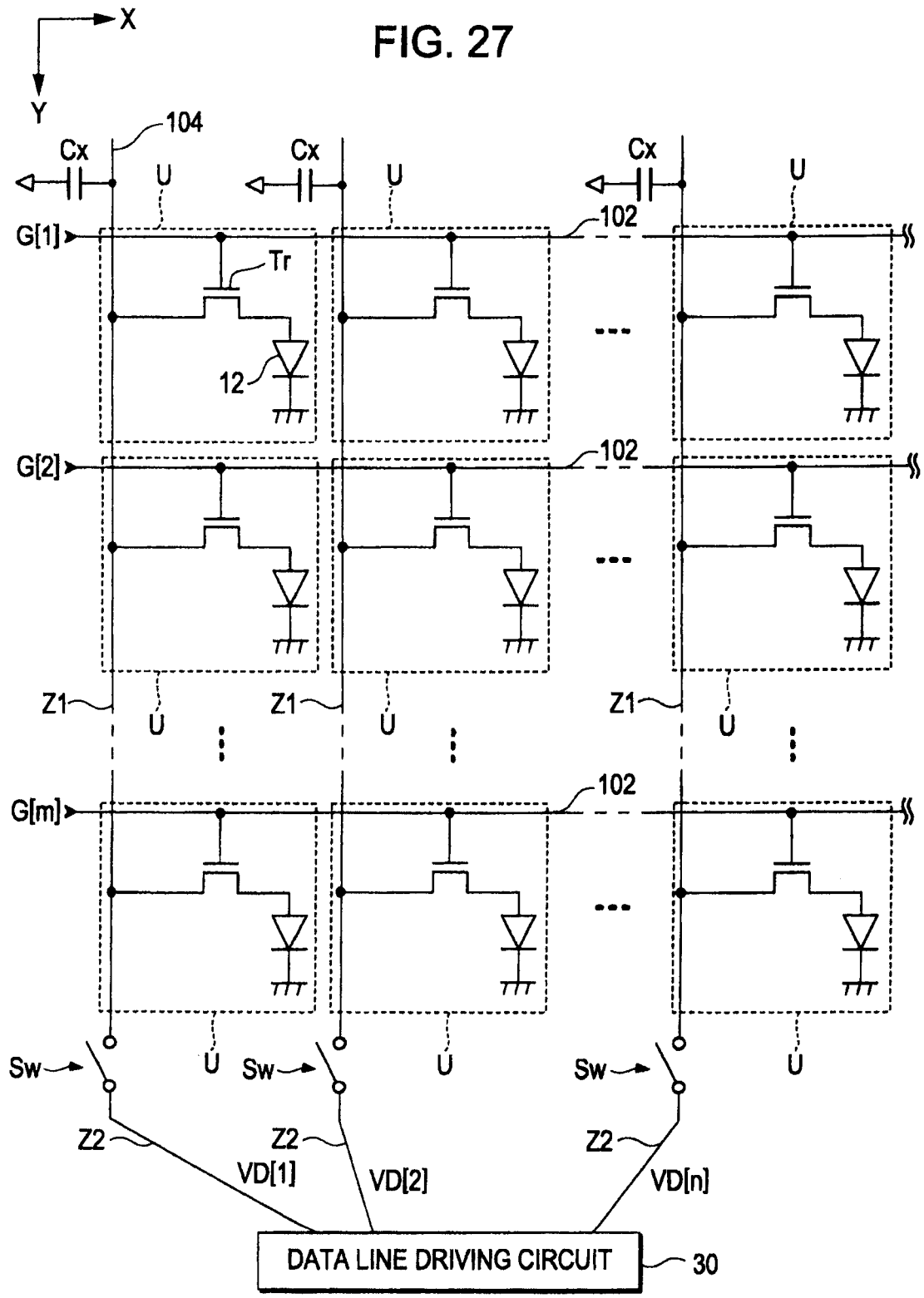
FIG. 27 is a circuit diagram showing the configuration of an electro-optical device according to modified example 6 of the invention.

In the above-described fifth embodiment, a configuration in which electric charges corresponding to the data electric potential VD are charged in the capacitance (parasitic capacitance) accompanied in the data line 104 has been exemplified. However, for example, as shown in FIG. 27, a configuration in which a capacitor element Cx used for charging electric charges in correspondence with the data electric potential VD is disposed in each data line 104 (the first part Z1) may be used. Even in such a case, as in the fifth embodiment, the capacitor element is not needed to be disposed in each unit circuit U. Accordingly, there is an advantage that high definition can be achieved. The number of the capacitor elements Cx disposed in each data line 104 may be one, or two or more. In addition, the position of the capacitor element Cx disposed in each data line 104 can be arbitrarily set.

Applied Example

Figure 28:
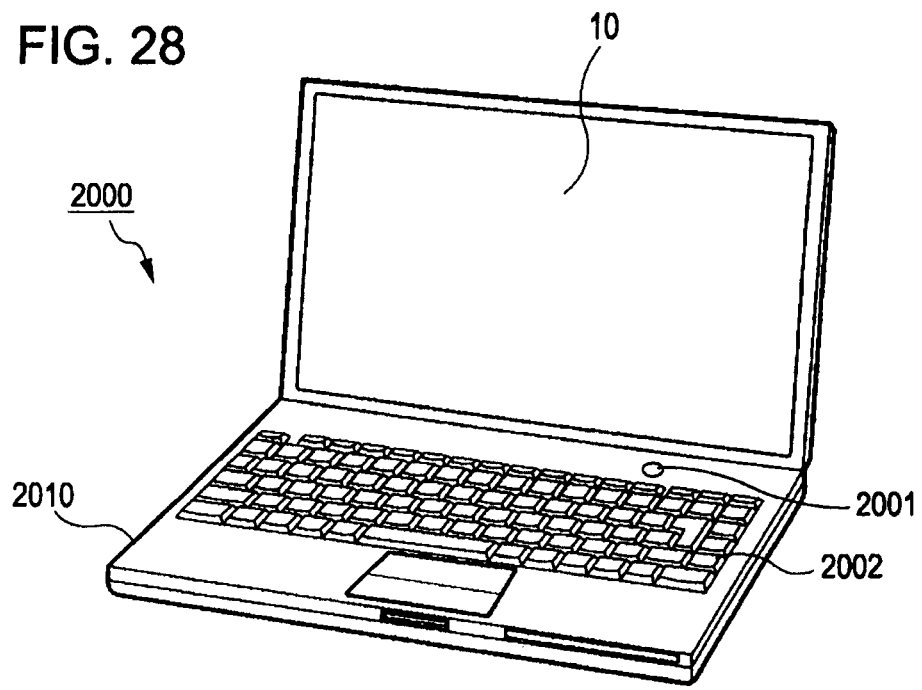
FIG. 28 is a perspective view showing a detailed form of an electronic apparatus according to an embodiment of the invention.

Next, an electronic apparatus using the electro-optical device 10 according to an embodiment of the invention will be described. FIG. 28 is a perspective view showing the configuration of a mobile personal computer that uses the electro-optical device 10 according to any one of the above-described embodiments as a display unit. The personal computer 2000 includes a light emitting unit 10 as the display unit and a main body 2010. In the main body 2010, a power switch 2001 and a keyboard 2002 are disposed. Since the electro-optical device 10 uses the OLED element as the electro-optical element 12, a screen that has a wide viewing angle and can be easily viewed can be displayed.

Figure 29:
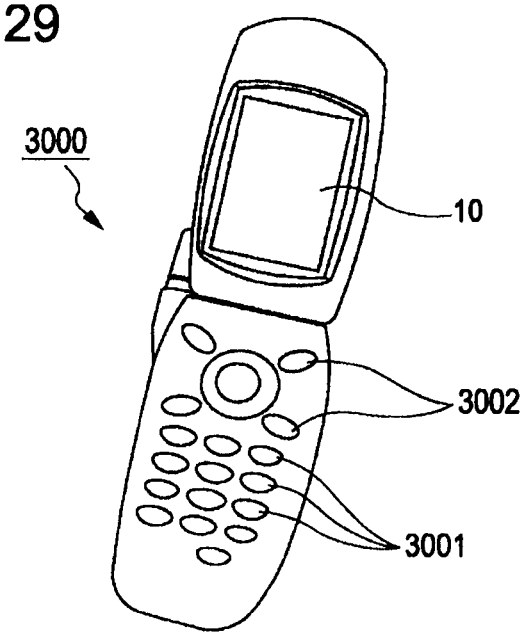
FIG. 29 is a perspective view showing a detailed form of an electronic apparatus according to an embodiment of the invention.

FIG. 29 shows the configuration of a cellular phone to which the electro-optical device 10 according to an embodiment of the invention is used. The cellular phone 3000 includes a plurality of operation buttons 3001, a scroll button 3002 and an electro-optical device 10 as a display unit. By operating the scroll button 3002, a screen displayed in the electro-optical device 10 is scrolled.

Figure 30:
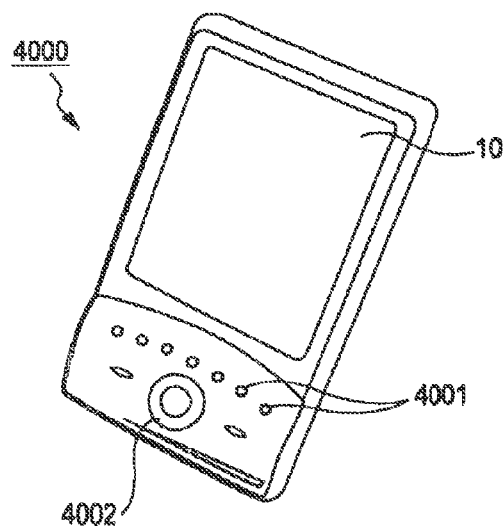
FIG. 30 is a perspective view showing a detailed form of an electronic apparatus according to an embodiment of the invention.
Figure 31:
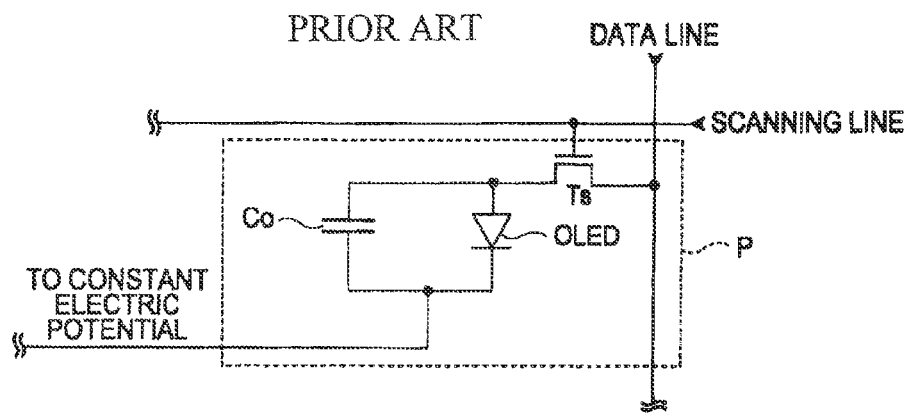
FIG. 31 is a circuit diagram showing the configuration of a general unit circuit.

FIG. 30 shows the configuration of a personal digital assistant (PDA) to which the electro-optical device 10 according to an embodiment of the invention is used. The personal digital assistant 4000 includes a plurality of operation buttons 4001, a power switch 4002, and the electro-optical device 10 as a display unit. By operating the power switch 4002, various types of information such as an address book or a schedule planner are displayed in the electro-optical device 10.

In addition, as electronic apparatuses to which an electro-optical device according to an embodiment of the invention is applied, in addition to the electronic apparatuses shown in FIGS. 28 to 30, there are a digital camera, a television set, a video camera, a car navigation system, a pager, an electronic organizer, an electronic paper sheet, a calculator, a word processor, a workstation, a video phone, a POS terminal, a printer, a scanner, a copier, a video player, an apparatus having a touch panel, and the like. The use of the electro-optical device according to an embodiment of the invention is not limited to display of an image. For example, in an image forming device such as an optical write-type printer or an electronic copier, a write head that exposes a photosensitive body in accordance with an image to be formed in a writing material such as a paper sheet is used. The electro-optical device according to an embodiment of the invention can be also used for the write head of such type. An electronic circuit described in the embodiments of the invention includes a circuit that becomes a unit for exposure in an image forming device, in addition to a pixel circuit constituting pixels of the display device as in the above-described embodiments.

What is claimed is:

1. An electro-optical device comprising:
   a plurality of unit circuits that are disposed in correspondence with intersections of a plurality of scanning lines and a plurality of data lines;
   a scanning line driving circuit that sequentially selects a scanning line of the plurality of scanning lines for a drive period; and
   a data line driving circuit that outputs data electric potentials corresponding to gray scale data to the plurality of data lines for a write period, wherein each of the write period and the drive period occur within a unit period, and each of the plurality of unit circuits has:
   an electro-optical element that has a gray scale level corresponding to the gray scale data;
   a capacitor element that has a first electrode connected to a capacitor line and a second electrode connected to a data line; and
   a first switching element that is disposed between the second electrode and the electro-optical element, the first switching element being in a conductive state at a time when the scanning line is selected by the scanning line driving circuit, the conductive state causing the second electrode and the electro-optical element to be electrically connected; wherein
   capacitor elements of unit circuits connected to a same data line are directly connected to each other.

2. The electro-optical device according to claim 1, further comprising:
   the capacitor line constituting a constant electric potential line, wherein the electro-optical element of each of the plurality of unit circuits includes a third electrode connected to the first switching element, a fourth electrode connected to a constant electric potential line to which a constant electric potential is supplied, and an optical layer that is interposed between the third electrode and the fourth electrode.

3. The electro-optical device according to claim 1, further comprising a plurality of second switching elements disposed between the data line driving circuit and one of the plurality of data lines, the plurality of second switching elements:
   (i) are each a switching element disposed in correspondence with one of the plurality of data lines,
   (ii) are each concurrently in a conductive state for the write period so as to make the data lines and the data line driving circuit be conductive to each other, and
   (iii) are each concurrently in a non-conductive state for the drive period so as to make the data lines and the data line driving circuit be non-conductive to each other.

4. The electro-optical device according to claim 3,
   each of the plurality of the data lines including (i) a first part that is connected to the plurality of the unit circuits and having a same length in the plurality of the data lines, and (ii) a second part that is connected to the data line driving circuit and has a different length in the plurality of the data lines,
   the second switching element connecting the second part to the first part for the write period.

5. An electronic apparatus including the electro-optical device according to claim 1.

6. A method of driving an electro-optical device including a plurality of unit circuits that are disposed in correspondence with intersections of a plurality of scanning lines and a plurality of data lines, each of the plurality of unit circuits including an electro-optical element that has a gray scale level corresponding to a data electric potential, a capacitor, and a first switching element,
   the method comprising:
   charging the capacitor during a write period of one unit period by outputting the data electric potentials to the plurality of data lines, the data electric potentials corresponding to the gray scale data of the unit circuit that is in correspondence with a scanning line;
   sequentially selecting the plurality of scanning lines, one scanning line being selected for a drive period of the one unit period; and
   supplying the data electric potential stored in the capacitor during the drive period of the one unit period to the electro-optical element of the unit circuit from the capacitor corresponding to the unit circuit belonging to the selected scanning line,
   wherein the capacitors of unit circuits connected to a same data line are directly connected to each other.

7. The method of driving the electro-optical device according to claim 6,
   the electro-optical element of each of the plurality of unit circuits including a third electrode connected to the first switching element, a fourth electrode connected to a constant electric potential line, an optical layer that is interposed between the third electrode and the fourth electrode, and a capacitor line constituting the constant electric potential line, the method further comprising,
   supplying a constant electric potential to the constant electric potential line.

8. The method of driving the electro-optical device according to claim 6, wherein each of the plurality of data lines further includes a plurality of second switching elements, the method further comprising:
   putting the second switching elements in a conductive state for the write period of one unit period,
   the write period being a period before the drive period; and
   putting the second switching elements in a non-conductive state for the drive period of one unit period,
   wherein the second switching element connects the data line driving circuit and one of the plurality of data lines.

9. The method of driving the electro-optical device according to claim 8,
   each of the plurality of the data lines including (i) a first part that is connected to the plurality of the unit circuits and having a same length in the plurality of the data lines, and (ii) a second part that is connected to the data line driving circuit and has a different length in the plurality of the data lines,
   the second switching element connecting the second part to the first part for the write period.

10. The method of driving the electro-optical device according to claim 6, the electro-optical device being included in an electronic apparatus.

* * * * *